United States Patent
Kim et al.

(10) Patent No.: US 12,477,792 B2
(45) Date of Patent: Nov. 18, 2025

(54) METHOD FOR MANUFACTURING A SEMICONDUCTOR DEVICE

(71) Applicant: SAMSUNG ELECTRONICS CO., LTD., Suwon-si (KR)

(72) Inventors: Ho-Jun Kim, Suwon-si (KR); Woong Sik Nam, Suwon-si (KR); Mirco Cantoro, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 18/594,124

(22) Filed: Mar. 4, 2024

(65) Prior Publication Data
US 2024/0204047 A1    Jun. 20, 2024

Related U.S. Application Data

(63) Continuation of application No. 18/102,204, filed on Jan. 27, 2023, now Pat. No. 11,955,516, which is a (Continued)

(30) Foreign Application Priority Data

Oct. 26, 2020    (KR) .................. 10-2020-0139044

(51) Int. Cl.
*H01L 29/06*    (2006.01)
*H01L 21/8234*    (2006.01)
(Continued)

(52) U.S. Cl.
CPC ......... *H10D 62/121* (2025.01); *H10D 64/021* (2025.01); *H10D 64/513* (2025.01); *H10D 84/0151* (2025.01); *H10D 84/038* (2025.01)

(58) Field of Classification Search
CPC ......... H01L 21/02603; H01L 21/28141; H01L 21/823431; H01L 21/823821;
(Continued)

(56) References Cited

U.S. PATENT DOCUMENTS 9,029,260 B2    5/2015    Lin et al.
9,741,854 B2    8/2017    Bai et al.
(Continued)

FOREIGN PATENT DOCUMENTS

KR    1020060069561 A    6/2006
KR    1020160122910 A    10/2016
(Continued)

OTHER PUBLICATIONS

Notice of Allowance in Korean Appln. No. 10-2020-0139044, mailed on Mar. 31, 2025, 5 pages (with English translation).

*Primary Examiner* — David C Spalla
(74) *Attorney, Agent, or Firm* — Fish & Richardson P.C.

(57) ABSTRACT

A semiconductor device includes first and second active patterns, a field insulating film between the first and second active patterns, a first gate structure intersecting the first active pattern and including a first gate electrode and a first gate spacer, a second gate structure intersecting the second active pattern and including a second gate electrode and a second gate spacer, a gate separation structure on the field insulating film between the first and second gate structures, the gate separation structure including a gate separation filling film on a gate separation liner, and a connecting spacer between the gate separation structure and the field insulating film, the connecting spacer protruding from a top surface of the field insulating film, and the gate separation liner contacting the connecting spacer and extending along a top surface and sidewalls of the connecting spacer and along the top surface of the field insulating film.

20 Claims, 33 Drawing Sheets

Related U.S. Application Data continuation of application No. 17/333,080, filed on May 28, 2021, now Pat. No. 11,569,349.

(51) Int. Cl.
| | | |
|---|---|---|
| *H01L 29/423* | (2006.01) | |
| *H01L 29/66* | (2006.01) | |
| *H10D 62/10* | (2025.01) | |
| *H10D 64/01* | (2025.01) | |
| *H10D 64/27* | (2025.01) | |
| *H10D 84/01* | (2025.01) | |
| *H10D 84/03* | (2025.01) | |

(58) Field of Classification Search
CPC .............. H01L 21/845; H01L 27/0886; H01L 27/0924; H01L 27/1211; H01L 29/0653; H01L 29/0665; H01L 29/0669; H01L 29/0673; H01L 29/41791; H01L 29/4236; H01L 29/66439; H01L 29/6653; H01L 29/66553; H01L 29/6656; H01L 29/66795; H01L 29/775; H01L 29/785; H01L 29/7851; H01L 29/7853; H01L 29/7855; H01L 2029/7858; H10D 30/014; H10D 30/6735; H10D 62/118; H10D 62/119; H10D 62/121; H10D 64/015; H10D 64/018; H10D 64/021; H10D 64/513; H10D 84/0151; H10D 84/038

See application file for complete search history.

(56) References Cited

U.S. PATENT DOCUMENTS

| | | | |
|---|---|---|---|
| 9,953,879 | B1 | 4/2018 | Sung et al. |
| 10,269,787 | B2 * | 4/2019 | Wang ................... H01L 29/0649 |
| 10,636,886 | B2 | 4/2020 | Jo et al. |
| 2018/0090493 | A1 | 3/2018 | Kwak et al. |
| 2018/0138174 | A1 * | 5/2018 | Min ..................... H01L 29/4232 |
| 2019/0157135 | A1 | 5/2019 | Ku et al. |
| 2019/0305099 | A1 | 10/2019 | Jo et al. |
| 2019/0393324 | A1 | 12/2019 | Chen et al. |
| 2020/0006354 | A1 | 1/2020 | Wen et al. |
| 2020/0013875 | A1 | 1/2020 | Chen et al. |
| 2020/0111700 | A1 | 4/2020 | Ku et al. |

FOREIGN PATENT DOCUMENTS

| | | |
|---|---|---|
| KR | 1020170061233 A | 6/2017 |
| KR | 1020180057812 A | 5/2018 |
| KR | 1020190054771 A | 5/2019 |
| KR | 1020190083231 A | 7/2019 |
| KR | 1020200013942 A | 2/2020 |

* cited by examiner

FIG. 24
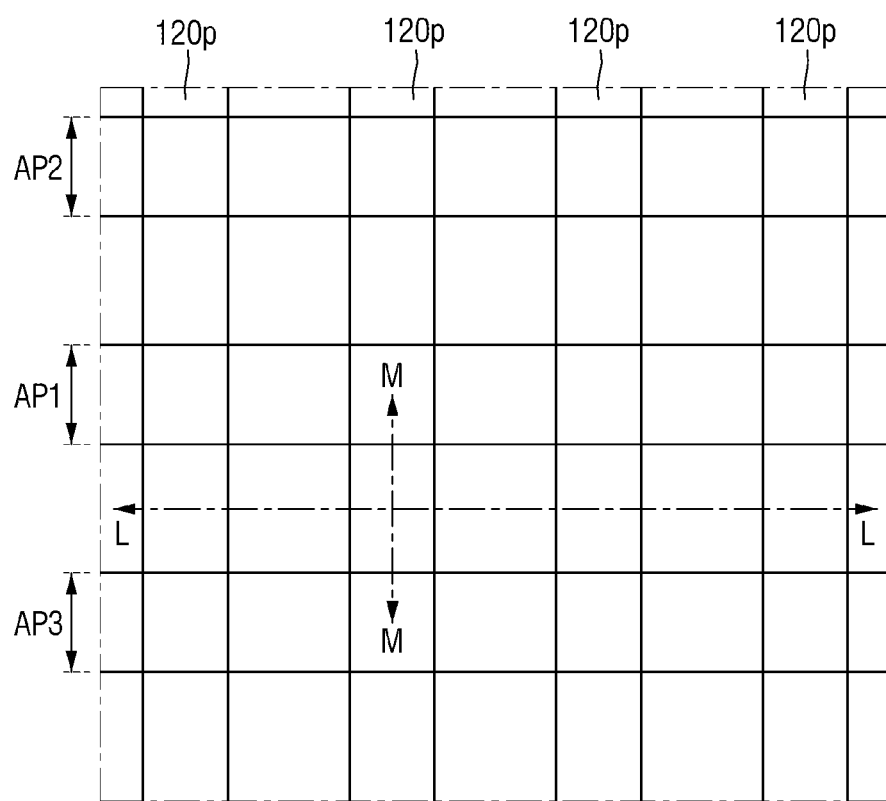
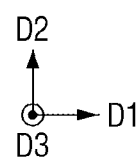

METHOD FOR MANUFACTURING A SEMICONDUCTOR DEVICE

CROSS-REFERENCE TO RELATED APPLICATION

This is a continuation of U.S. patent application Ser. No. 18/102,204 filed Jan. 27, 2023, which is a continuation of U.S. patent application Ser. No. 17/333,080 filed May 28, 2021 (issued as U.S. patent Ser. No. 11/569,349), which is incorporated by reference herein in its entirety.

Korean Patent Application No. 10-2020-0139044, filed on Oct. 26, 2020, in the Korean Intellectual Property Office, and entitled: "Semiconductor Device," is incorporated by reference herein in its entirety.

BACKGROUND

1. Field

The present disclosure relates to a semiconductor device.

2. Description of the Related Art

As semiconductor devices have become highly integrated, it has increasingly become difficult to meet the level of transistor performance required by users. In order to overcome such technical difficulties, various field-effect transistor (FET) structures have been proposed. For example, high-k film-metal gate structures, which use silicon oxide and polycrystalline silicon as their gate insulating layer material and gate electrode material, respectively, have been proposed to replace existing field effect transistors.

As the feature size of FETs decreases, the lengths of gates and channels formed below the FETs also decrease. To improve the operation stability and reliability of transistors, which are important factors that determine the performance of integrated circuits (ICs), various efforts have been made to improve the structure and the fabrication of IC elements.

SUMMARY

According to an embodiment of the present disclosure, there is provided a semiconductor device including, a first active pattern extending in a first direction, a second active pattern extending in the first direction, the second active pattern being adjacent to the first active pattern in a second direction, which is different from the first direction, a field insulating film disposed between the first and second active patterns, a first gate structure intersecting the first active pattern, extending in the second direction, and including a first gate electrode and a first gate spacer, a second gate structure intersecting the second active pattern, extending in the second direction, and including a second gate electrode and a second gate spacer, a gate separation structure disposed on the field insulating film between the first and second gate structures and a connecting spacer disposed between the gate separation structure and the field insulating film, the connecting spacer protruding from a top surface of the field insulating film, wherein the gate separation structure includes a gate separation liner and a gate separation filling film on the gate separation liner, and the gate separation liner extends along a top surface and sidewalls of the connecting spacer and along the top surface of the field insulating film and is in contact with the connecting spacer.

According to the aforementioned and other embodiments of the present disclosure, there is provided a semiconductor device including, a first active pattern extending in a first direction, a second active pattern extending in the first direction, the second active pattern being adjacent to the first active pattern in a second direction, which is different from the first direction, a field insulating film disposed between the first and second active patterns, a first gate structure intersecting the first active pattern and extending in the second direction, a second gate structure intersecting the second active pattern and extending in the second direction, third and fourth gate structures disposed with the first and second gate structures interposed therebetween, the third and fourth gate structures intersecting the first and second active patterns, a connecting spacer disposed on the field insulating film between the first and second gate structures, an interlayer insulating film disposed on the field insulating film between the first and second gate structures and covering sidewalls of the connecting spacer, a gate separation trench separating the first and second gate structures, the gate separation trench being defined by the interlayer insulating film, the connecting spacer, and a top surface of the field insulating film, and a gate separation structure filling the gate separation trench and including a gate separation liner and a gate separation filling film, wherein the gate separation liner extends along the profile of the gate separation trench and is in contact with the connecting spacer, and the gate separation filling film is disposed on the gate separation liner and fills the gate separation trench.

According to the aforementioned and other embodiments of the present disclosure, there is provided a semiconductor device including, a first active pattern including a first lower pattern, which extends in a first direction, and first sheet patterns, which are spaced apart from the first lower pattern, a second active pattern including a second lower pattern, which extends in the first direction, and second sheet patterns, which are spaced apart from the second lower pattern, the second lower pattern being adjacent to the first lower pattern in a second direction, which is different from the first direction, a field insulating film disposed between the first and second lower patterns, a first gate structure intersecting the first active pattern, extending in the second direction, and including a first gate insulating film, a first gate electrode, and a first gate spacer, a second gate structure intersecting the second active pattern, extending in the second direction, and including a second gate insulating film, a second gate electrode, and a second gate spacer, a gate separation structure disposed on the field insulating film between the first and second gate structures and a connecting spacer disposed between the gate separation structure and the field insulating film, the connecting spacer protruding from a top surface of the field insulating film, wherein the gate separation structure includes a gate separation liner and a gate separation filling film on the gate separation liner, the gate separation liner extends along a top surface and sidewalls of the connecting spacer and the top surface of the field insulating film and is in contact with the connecting spacer, the first and second gate insulating films do not extend along sidewalls of the gate separation structure, and a height from a top surface of the gate separation structure to a lowermost part of the gate separation structure is greater than a depth from the top surface of the gate separation structure to a bottom surface of the connecting spacer.

BRIEF DESCRIPTION OF THE DRAWINGS

Features will become apparent to those of skill in the art by describing in detail exemplary embodiments with reference to the attached drawings, in which:

FIGS. 24 through 32 are layout views or cross-sectional views of stages in a method of fabricating a semiconductor device according to some embodiments.

DETAILED DESCRIPTION

FIGS. 1 through 32 illustrate semiconductor devices according to some embodiments of the present disclosure as including fin field-effect transistors (FinFETs) with fin-type channel regions, transistors with nanowires or nanosheets, or multibridge channel field-effect transistors (MBCFETs), but the present disclosure is not limited thereto. Also, the semiconductor devices according to some embodiments of the present disclosure may include tunneling field-effect transistors (FETs) or three-dimensional (3D) transistors. Also, the semiconductor devices according to some embodiments of the present disclosure may include planar transistors. Also, the semiconductor devices according to some embodiments of the present disclosure may be applicable to two-dimensional (2D) material-based FETs and heterostructures thereof. Also, the semiconductor devices according to some embodiments of the present disclosure may include bipolar junction transistors or laterally-diffused metal-oxide semiconductor (LDMOS) transistors.

Figure 1:
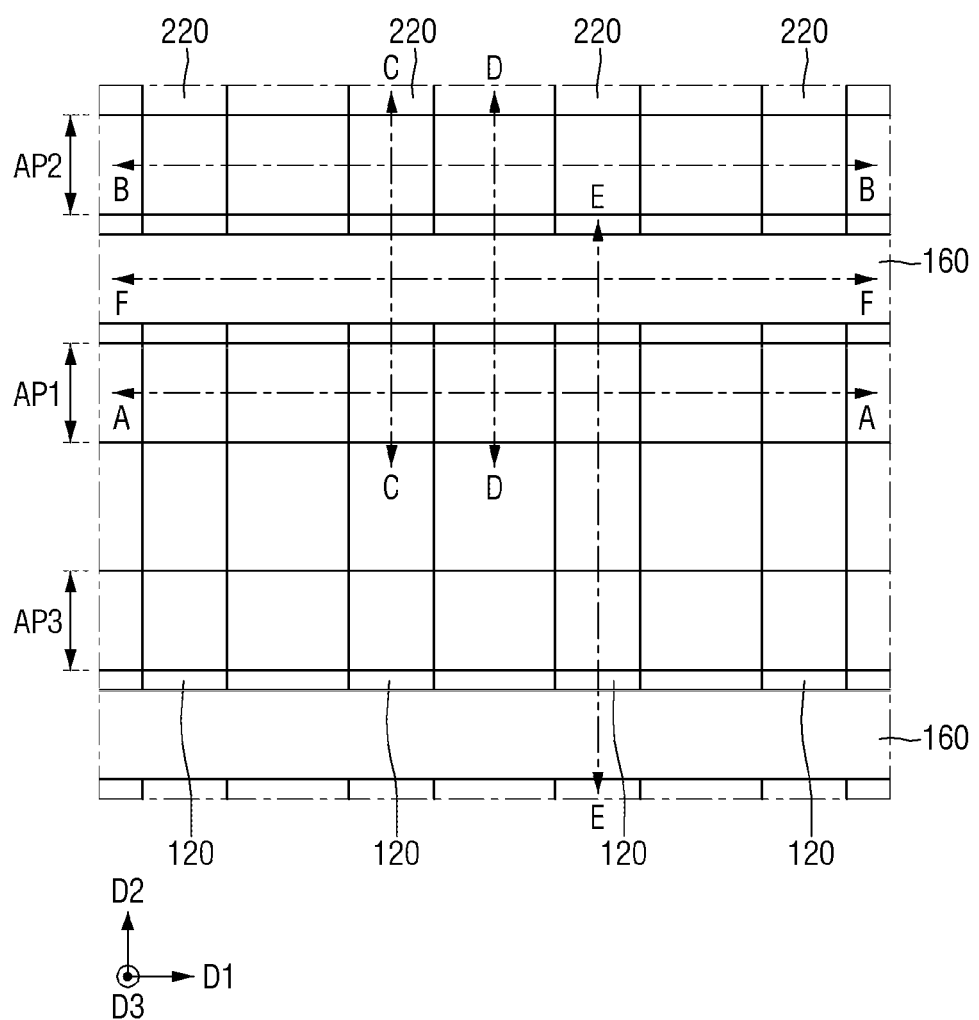
FIG. 1 is a layout view of a semiconductor device according to some embodiments of the present disclosure.
Figure 2A:
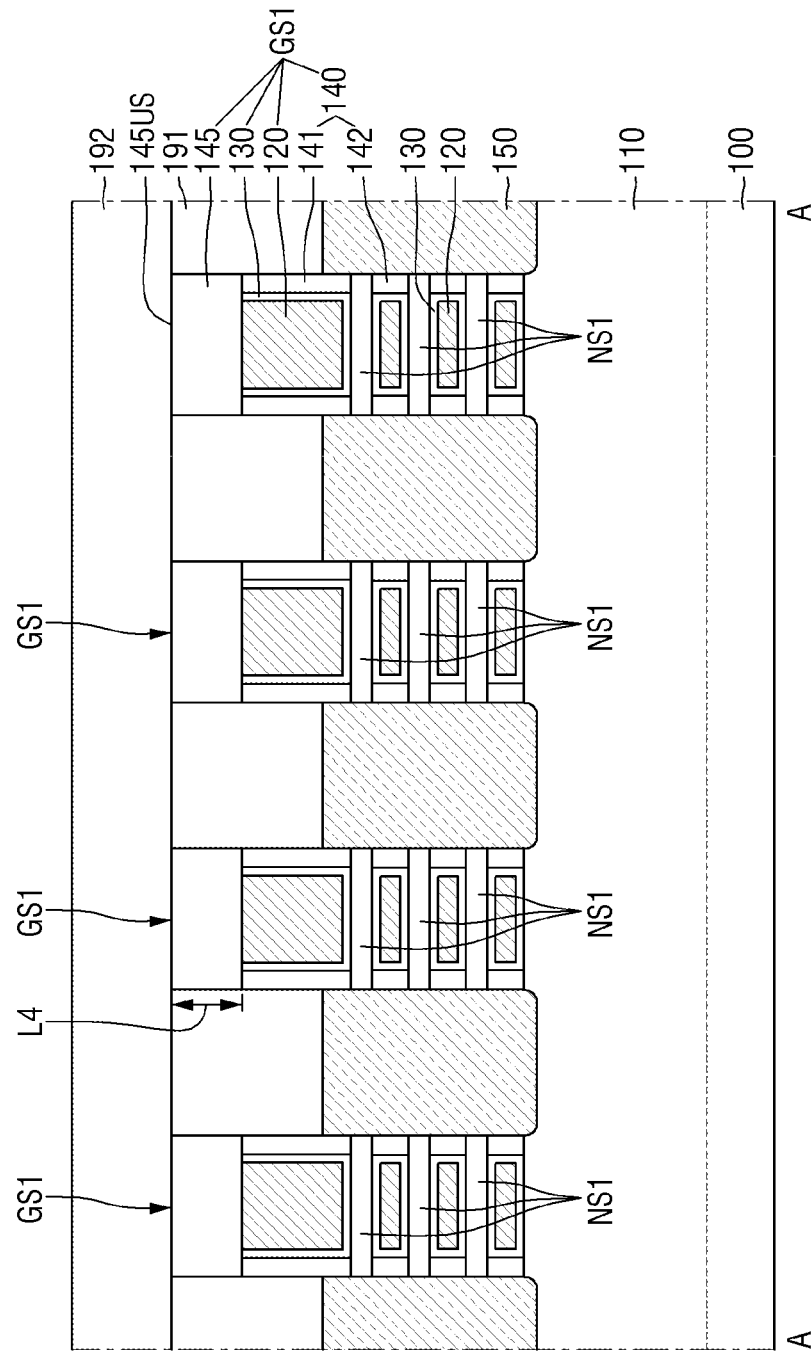
FIGS. 2A and 2B are cross-sectional views taken along line A-A of FIG. 1.
Figure 2B:
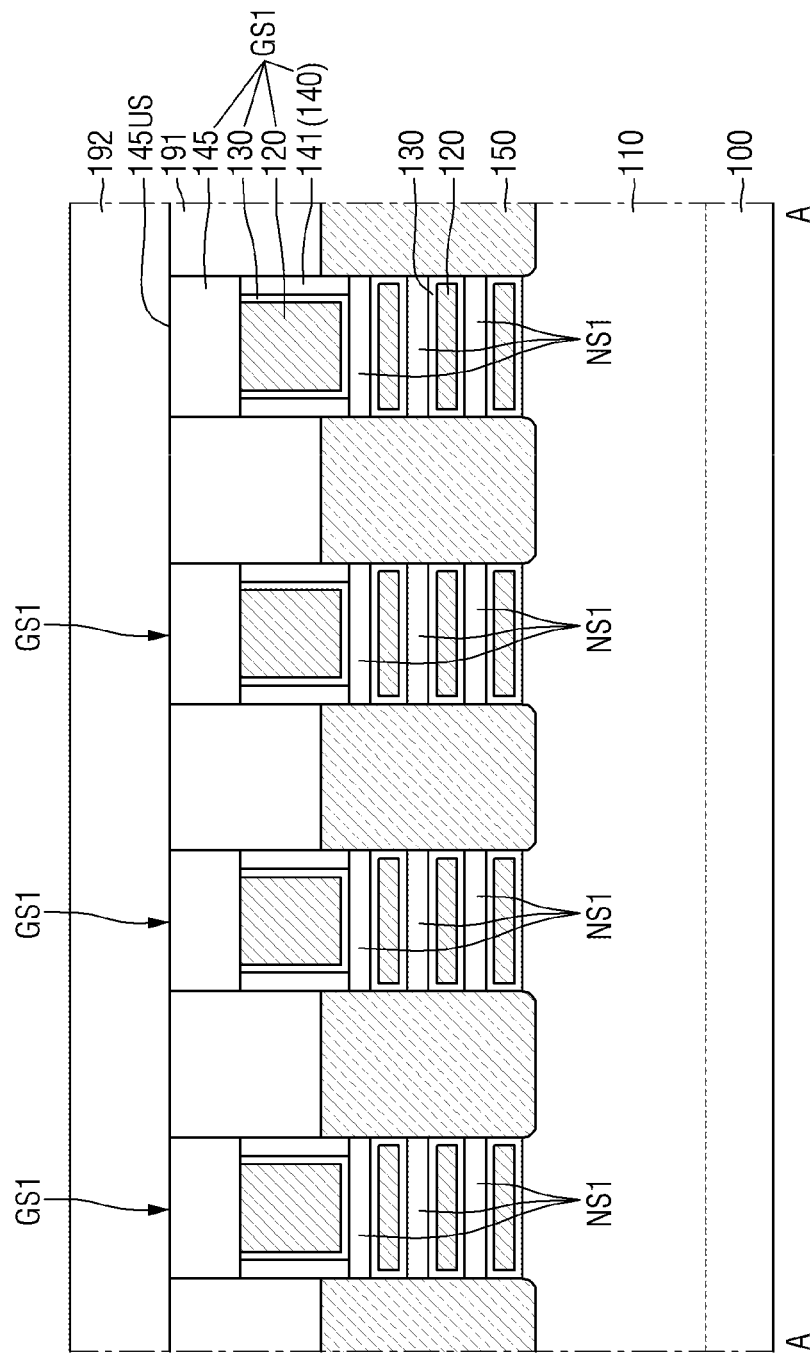
Figure 3:
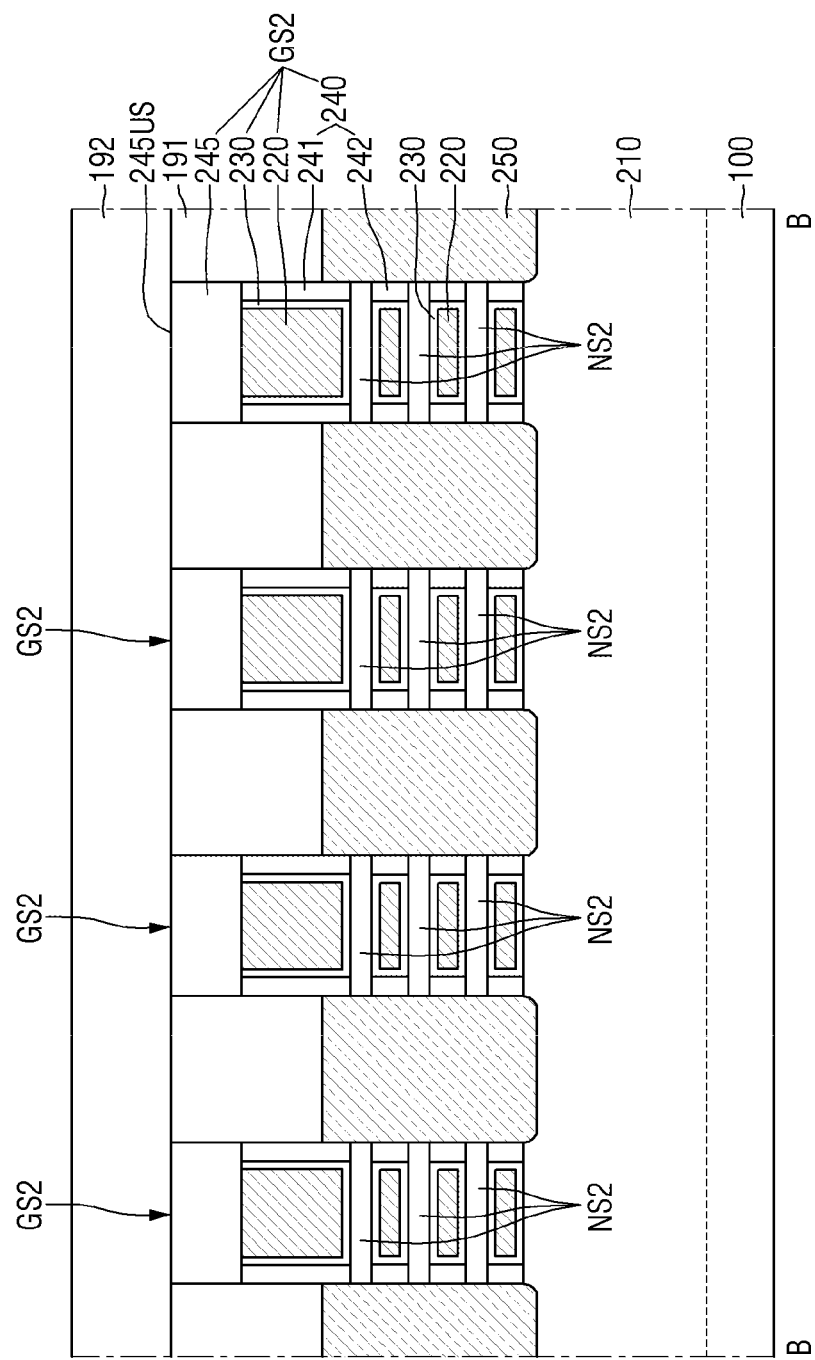
FIGS. 3, 4, 5, 6, and 7 are cross-sectional views taken along lines B-B, C-C, D-D, E-E, and F-F, respectively, of FIG. 1.

FIG. 1 is a layout view of a semiconductor device according to some embodiments of the present disclosure. FIGS. 2A and 2B are cross-sectional views taken along line A-A of FIG. 1. FIGS. 3, 4, 5, 6, and 7 are cross-sectional views taken along lines B-B, C-C, D-D, E-E, and F-F, respectively, of FIG. 1. For convenience, a first interlayer insulating film 191, a second interlayer insulating film 192, and wire lines 195 are not illustrated in FIG. 1.

Referring to FIGS. 1 through 7, the semiconductor device according to some embodiments of the present disclosure may include first, second, and third active patterns AP1, AP2, and AP3, a plurality of first gate electrodes 120, a plurality of second gate electrodes 220, and first gate separation structures 160 on a substrate 100.

The substrate 100 may include, e.g., bulk silicon or a silicon-on-insulator (SOI). Alternatively, the substrate 100 may be a silicon substrate or may include a material other than silicon, e.g., silicon germanium, a silicon germanium-on-insulator (SGOI), indium antimonide, a lead tellurium compound, indium arsenic, indium phosphide, gallium arsenic, or gallium antimonide, but the present disclosure is not limited thereto.

The first, second, and third active patterns AP1, AP2, and AP3 may be disposed on the substrate 100. The first, second, and third active patterns AP1, AP2, and AP3 may extend in a first direction D1. The first, second, and third active patterns AP1, AP2, and AP3 may be disposed to be spaced apart from one another in a second direction D2. For example, the first direction D1 may be a direction that intersects the second direction D2. The first active pattern AP1 may be disposed between the second and third active patterns AP2 and AP3. The first active pattern AP1 may be adjacent to the second and third active patterns AP2 and AP3 in the second direction D2.

The first and third active patterns AP1 and AP3 may be disposed between a pair of adjacent first gate separation structures 160 that extend in the first direction D1. A first gate separation structure 160 may be disposed between the first and second active patterns AP1 and AP2. The first gate separation structures 160 will be described later.

For example, the first and third active patterns AP1 and AP3 may be active regions included in a single standard cell. For example, the first active pattern AP1 may be a region where a P-type metal-oxide semiconductor (PMOS) transistor is formed, and the third active pattern AP3 may be a region where an N-type metal-oxide semiconductor (NMOS) transistor is formed. In another example, the first active pattern AP1 may be a region where an NMOS transistor is formed, and the third active pattern AP3 may be a region where a PMOS transistor is formed.

For example, the second active pattern AP2 may be a region where a transistor of the same conductivity type as the transistor formed in the first active pattern AP1 is formed. For example, if a PMOS transistor is formed in the first active pattern AP1, a PMOS transistor may also be formed in the second active pattern AP2. In another example, if an NMOS transistor is formed in the first active pattern AP1, an NMOS transistor may also be formed in the second active pattern AP2.

The first active pattern AP1 may include a first lower pattern 110 and a plurality of first sheet patterns NS1. The second active pattern AP2 may include a second lower pattern 210 and a plurality of second sheet patterns NS2. The third active pattern AP3 may include a third lower pattern 310 and a plurality of third sheet patterns NS3.

The first, second, and third lower patterns 110, 210, and 310 may protrude from the substrate 100. The first, second, and third lower patterns 110, 210, and 310 may extend in the first direction D1.

The first lower pattern 110 may be spaced apart from the second and third lower patterns 210 and 310 in the second direction D2. The first, second, and third lower patterns 110, 210, and 310 may be separated by fin trenches FT, which extend in the first direction D1.

The first sheet patterns NS1 may be disposed on the first lower pattern 110. The first sheet patterns NS1 may be spaced apart from the first lower pattern 110 in a third direction D3. The first sheet patterns NS1, which are spaced apart from one another, may be arranged in the first direction D1 along the top surface of the first lower pattern 110. The third sheet patterns NS3 may have almost the same structure as the first sheet patterns NS1.

The second sheet patterns NS2 may be disposed on the second lower pattern 210. The second sheet patterns NS2 may be spaced apart from the second lower pattern 210 in the third direction D3. The second sheet patterns NS2, which are spaced apart from one another, may be arranged in the first direction D1 along the top surface of the second lower pattern 210.

Each of the first sheet patterns NS1 may include a plurality of nanosheets that are sequentially arranged in the third direction D3. Each of the second sheet patterns NS2 may include a plurality of nanosheets that are sequentially arranged in the third direction D3. Each of the third sheet patterns NS3 may include a plurality of nanosheets that are sequentially arranged in the third direction D3. Here, the third direction D3 may be a direction that intersects the first and second directions D1 and D2. For example, the third direction D3 may be the thickness direction of the substrate 100, e.g., the third direction D3 may be along a normal direction to a bottom of the substrate 100. FIGS. 2A, 2B, 3, 4, and 6 illustrate that three first sheet patterns NS1, three second sheet patterns NS2, and three third sheet patterns NS3 are arranged in the third direction D3, but the present disclosure is not limited thereto.

The first, second, and third lower patterns 110, 210, and 310 may be formed by etching parts of the substrate 100 and may include epitaxial layers grown from the substrate 100. The first, second, and third lower patterns 110, 210, and 310 may include an element semiconductor material, e.g., silicon or germanium. The first, second, and third lower patterns 110, 210, and 310 may include a compound semiconductor, e.g., a group IV-IV compound semiconductor or a group III-V compound semiconductor.

The group IV-IV compound semiconductor may be, e.g., a binary or ternary compound including at least two of carbon (C), silicon (Si), germanium (Ge), and tin (Sn) or a compound obtained by doping the binary or ternary compound with a group IV element. The group III-V compound semiconductor may be, e.g., a binary, ternary, or quaternary compound obtained by combining at least one of aluminum (Al), gallium (Ga), and indium (In) and a group V element such as phosphorus (P), arsenic (As), or antimony (Sb).

The first sheet patterns NS1 may include one of an element semiconductor material (such as silicon or germanium), a group IV-IV compound semiconductor, and a group III-V compound semiconductor. The second sheet patterns NS2 may include one of an element semiconductor material (such as silicon or germanium), a group IV-IV compound semiconductor, and a group III-V compound semiconductor. The third sheet patterns NS3 may include one of an element semiconductor material (such as silicon or germanium), a group IV-IV compound semiconductor, and a group III-V compound semiconductor.

For example, the width, in the second direction D2, of the first sheet patterns NS1 may increase or decrease in proportion to the width, in the second direction D2, of the first lower pattern 110.

Field insulating films 105 may be formed on the substrate 100. The field insulating films 105 may fill at least parts of the fin trenches FT. The field insulating films 105 may be disposed between the first and second active patterns AP1 and AP2 and between the first and third active patterns AP1 and AP3.

The field insulating films 105 may cover the sidewalls of the first lower pattern 110, the sidewalls of the second lower pattern 210, and the sidewalls of the third lower pattern 310. Alternatively, parts of the first, second, and third lower patterns 110, 210, and 310 may protrude beyond top surfaces 105US of the field insulating films 105 in the third direction D3.

The first sheet patterns NS1, the second sheet patterns NS2, and the third sheet patterns NS3 may be located higher than the top surfaces 105US of the field insulating films 105. The field insulating films 105 may include, e.g., an oxide film, a nitride film, an oxynitride film, or a combination thereof.

A plurality of first gate structures GS1 may be disposed on the substrate 100. The first gate structures GS1 may be disposed between the first gate separation structures 160, which extend in the first direction D1. The first gate structures GS1 may extend in the second direction D2. The first gate structures GS1 may be spaced apart from one another in the first direction D1. The first gate structures GS1 may be disposed on the first and third active patterns AP1 and AP3. The first gate structures GS1 may intersect the first and third active patterns AP1 and AP3.

A plurality of second gate structures GS2 may be disposed on the substrate 100. The second gate structures GS2 may extend in the second direction D2. The second gate structures GS2 may be spaced apart from one another in the first direction D1. The first gate structures GS1 may face the second gate structures GS2 with one of the first gate separation structures 160 interposed therebetween. In other words, the first gate structures GS1 may be aligned, e.g., colinear, with the second gate electrodes GS2 in the second direction D2.

The second gate structures GS2 may be disposed on the second active pattern AP2. The second gate structures GS2 may intersect the second active pattern AP2.

Each of the first gate structures GS1 may include, e.g., the first gate electrodes 120, first gate insulating films 130, first gate spacers 140, and first gate capping patterns 145. Each of the second gate structures GS2 may include, e.g., the second gate electrodes 220, second gate insulating films 230, second gate spacers 240, and second gate capping patterns 245.

The first gate electrodes 120 may be formed on the first and third lower patterns 110 and 310. The first gate electrodes 120 may intersect the first and third lower patterns 110 and 310. The first gate electrodes 120 may surround the first sheet patterns NS1 and the third sheet patterns NS3.

The second gate electrodes 220 may be formed on the second lower pattern 210. The second gate electrodes 220 may intersect the second lower pattern 210. The second gate electrodes 220 may surround the second sheet patterns NS2.

The first gate electrodes 120 and the second gate electrodes 220 may include, e.g., at least one of a metal, a metal alloy, a conductive metal nitride, a metal silicide, a doped semiconductor material, a conductive metal oxide, and a conductive metal oxynitride. The first gate electrodes 120 and the second gate electrodes 220 may include, e.g., at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC-N), titanium aluminum carbide (TiAlC), titanium carbide (TiC), tantalum carbonitride (TaCN), Tungsten (W), Al, copper (Cu), cobalt (Co), titanium (Ti), tantalum (Ta), nickel (Ni), platinum (Pt), nickel platinum (Ni-Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof, but the present disclosure is not limited thereto. Here, the conductive metal oxide and the conductive metal oxynitride may include oxides of the aforementioned materials, but the present disclosure is not limited thereto.

Four first gate electrodes 120 and four second gate electrodes 220 are illustrated as being provided in each of the first gate structures GS1 and each of the second gate structures GS2, respectively, but the present disclosure is not limited thereto. The numbers of first gate electrodes 120 and second gate electrodes 220 may be greater than, (or less than) four.

The first gate insulating films 130 may extend along the top surfaces 105US of the field insulating films 105, the top surface of the first lower pattern 110, and the top surface of the third lower pattern 310. The first gate insulating films 130 may surround the first sheet patterns NS1 and the third sheet patterns NS3. The first gate insulating films 130 may be disposed along the circumferences of the first sheet patterns NS1 and the circumferences of the third sheet patterns NS3. The first gate electrodes 120 are disposed on the first gate insulating films 130.

The second gate insulating films 230 may extend along the top surfaces 105US of the field insulating films 105 and the top surface of the second lower pattern 210. The second gate insulating films 230 may surround the second sheet patterns NS2. The second gate insulating films 230 may be disposed along the circumferences of the second sheet patterns NS2. The second gate electrodes 220 are disposed on the second gate insulating films 230.

The first gate insulating films 130 and the second gate insulating films 230 may include silicon oxide, silicon oxynitride, silicon nitride, or a high-k material having a greater dielectric constant than silicon oxide. The high-k material may include, e.g., one of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The semiconductor device according to some embodiments of the present disclosure may include negative capacitance (NC) FETs using negative capacitors. For example, the first gate insulating films 130 and the second gate insulating films 230 may include ferroelectric material films having ferroelectric properties and paraelectric material films having paraelectric properties.

The ferroelectric material films may have negative capacitance, and the paraelectric material films may have positive capacitance. For example, if two or more capacitors are connected in series and have positive capacitance, the total capacitance of the two or more capacitors may be lower than the capacitance of each of the two or more capacitors. On the contrary, if at least one of the two or more capacitors has negative capacitance, the total capacitance of the two or more capacitors may have a positive value and may be greater than the absolute value of the capacitance of each of the two or more capacitors.

If the ferroelectric material films having negative capacitance and the paraelectric material films having positive capacitance are connected in series, the total capacitance of the ferroelectric material films and the paraelectric material films may increase. Accordingly, transistors having the ferroelectric material films can have a sub-threshold swing (SS) of less than 60 mV/decade at room temperature.

The ferroelectric material films may have ferroelectric properties. The ferroelectric material films may include, e.g., at least one of hafnium oxide, hafnium zirconium oxide, barium strontium titanium oxide, barium titanium oxide, and lead zirconium titanium oxide. Here, the hafnium zirconium oxide may be a material obtained by doping hafnium oxide with zirconium (Zr), and the hafnium zirconium oxide may be a compound of hafnium (Hf), zirconium, and oxygen (O).

The ferroelectric material films may further include a dopant. For example, the dopant may include at least one of aluminum, titanium, niobium, lanthanum (La), yttrium (Y), magnesium (Mg), silicon, calcium (Ca), cerium (Ce), dysprosium (Dy), erbium (Er), gadolinium (Gd), germanium, scandium (Sc), strontium (Sr), and tin. The type of dopant may vary depending on the type of material of the ferroelectric material films.

If the ferroelectric material films include hafnium oxide, the dopant of the ferroelectric material films may include, e.g., at least one of gadolinium, silicon, zirconium, aluminum, and yttrium.

If the dopant of the ferroelectric material films is aluminum, the ferroelectric material films may include 3 atomic % (at %) to 8 at % of aluminum. The ratio of the dopant in the ferroelectric material films may refer to the ratio of the sum of the amounts of hafnium and aluminum to the amount of aluminum in the ferroelectric material films.

If the dopant of the ferroelectric material films is silicon, the ferroelectric material films may include 2 at % to 10 at % of silicon. If the dopant of the ferroelectric material films is yttrium, the ferroelectric material films may include 2 at % to 10 at % of yttrium. If the dopant of the ferroelectric material films is gadolinium, the ferroelectric material films may include 1 at % to 7 at % of gadolinium. If the dopant of the ferroelectric material films is zirconium, the ferroelectric material films may include 50 at % to 80 at % of zirconium.

The paraelectric material films may include paraelectric properties. The paraelectric material films may include, e.g., at least one of silicon oxide and a high-k metal oxide. The high-k metal oxide may include, e.g., at least one of hafnium oxide, zirconium oxide, and aluminum oxide, but the present disclosure is not limited thereto.

The ferroelectric material films and the paraelectric material films may include the same material. The ferroelectric material films may have ferroelectric properties, but the paraelectric material films may not have ferroelectric properties. For example, if the ferroelectric material films and the paraelectric material films include hafnium oxide, the hafnium oxide included in the ferroelectric material films may have a different crystalline structure from the hafnium oxide included in the paraelectric material films.

The ferroelectric material films may be thick enough to exhibit ferroelectric properties. The ferroelectric material films may have a thickness of, e.g., 0.5 nm to 10 nm, but the present disclosure is not limited thereto. A critical thickness that can exhibit ferroelectric properties may vary depending on the type of ferroelectric material, and thus, the thickness of the ferroelectric material films may vary depending on the type of ferroelectric material included in the ferroelectric material films.

For example, the first gate insulating films 130 and the second gate insulating films 230 may each include a single ferroelectric material film. In another example, the first gate insulating films 130 and the second gate insulating films 230 may each include a plurality of ferroelectric material films. The first gate insulating films 130 and the second gate insulating films 230 may have a structure in which a plurality of ferroelectric material films and a plurality of paraelectric material films are alternately stacked.

The first gate spacers 140 may be disposed on pairs of sidewalls of the first gate electrodes 120. For example, as illustrated in FIG. 2A, the first gate spacers 140 disposed on the first lower pattern 110 may include first outer spacers 141 and first inner spacers 142. The first inner spacers 142 may be disposed between first sheet patterns NS1 that are adjacent to one another in the third direction D3. In another example, as illustrated in FIG. 2B, the first gate spacers 140 disposed on the first lower pattern 110 may include only first outer spacers 141, but may not include first inner spacers 142.

The second gate spacers 240 may be disposed on pairs of sidewalls of the second gate electrodes 220. As the first and second active patterns AP1 and AP2 may be regions where transistors of the same conductivity type are formed, the second gate spacers 240, which are disposed on the second lower pattern 210, may have the same structure as the first gate spacers 140 disposed on the first lower pattern 110. For example, if the first gate spacers 140 disposed on the first lower pattern 110 include both the first outer spacers 141 and the first inner spacers 142, the second gate spacers 240 may include both second outer spacers 241 and second inner spacers 242. In another example, if the first gate spacers 140 disposed on the first lower pattern 110 do not include first inner spacers 142, the second gate spacers 240 may not include second inner spacers 242.

For example, the first gate spacers 140 disposed on the third lower pattern 310 may include the first outer spacers 141 and the first inner spacers 142. In another example, the first gate spacers 140 disposed on the third lower pattern 310 may include only the first outer spacers 141, but may not include the first inner spacers 142.

Outer spacers (141 and 241) and inner spacers (142 and 242) may include, e.g., at least one of silicon nitride (SiN), silicon oxynitride (SiON), silicon oxide (SiO2), silicon oxycarbide (SiOCN), silicon boron nitride (SiBN), silicon oxyboron nitride (SiOBN), silicon oxycarbide (SiOC), and a combination thereof.

The first gate capping patterns 145 may be disposed on the first gate electrodes 120 and the first gate spacers 140. Top surfaces 145US of the first gate capping patterns 145 may be placed on the same plane as the top surfaces of the first interlayer insulating films 191. Alternatively, the first gate capping patterns 145 may be disposed between the first gate spacers 140.

The second gate capping patterns 245 may be disposed on the second gate electrodes 220 and the second gate spacers 240. Top surfaces 245US of the second gate capping patterns 245 may be placed on the same plane as the top surfaces of the first interlayer insulating films 191.

Alternatively, the second gate capping patterns 245 may be disposed between the second gate spacers 240.

The first gate capping patterns 145 and the second gate capping patterns 245 may include, e.g., at least one of silicon nitride, silicon oxynitride, silicon carbonitride (SiCN), silicon oxycarbide (SiOCN), and a combination thereof. The first gate capping patterns 145 and the second gate capping patterns 245 may include a material having etching selectivity with respect to the first interlayer insulating films 191.

A plurality of first source/drain patterns 150 may be disposed on the first lower pattern 110. The first source/drain patterns 150 may be disposed between stacks of first gate electrodes 120 that are adjacent to one another in the first direction D1. The first source/drain patterns 150 may be connected to stacks of first sheet patterns NS1 that are adjacent to one another in the first direction D1.

A plurality of second source/drain patterns 250 may be disposed on the second lower pattern 210. The second source/drain patterns 250 may be disposed between stacks of second gate electrodes 220 that are adjacent to one another in the first direction D1. The second source/drain patterns 250 may be connected to stacks of second sheet patterns NS2 that are adjacent to one another in the first direction D1.

The first source/drain patterns 150 may be included in the sources/drains of transistors that use the first sheet patterns NS1 as channel regions. The second source/drain patterns 250 may be included in the sources/drains of transistors that use the second sheet patterns NS2 as channel regions.

Source/drain contacts may be disposed on the first source/drain patterns 150 and the second source/drain patterns 250. Metal silicide films may be further disposed between the source/drain contacts and respective ones of the first source/drain patterns 150 and the second source/drain patterns 250. The first source/drain patterns 150 and the second source/drain patterns 250 may have similar cross-sectional shapes as an arrow, but the present disclosure is not limited thereto.

The first interlayer insulating films 191 may be disposed on the field insulating films 105. The first interlayer insulating films 191 may cover pairs of sidewalls of the first gate structures GS1 and pairs of sidewalls of the second gate structures GS2. The first interlayer insulating films 191 may be formed on the first source/drain patterns 150 and the second source/drain patterns 250. The first interlayer insulating films 191 may include, e.g., silicon oxide or an oxide-based insulating material.

Figure 7:
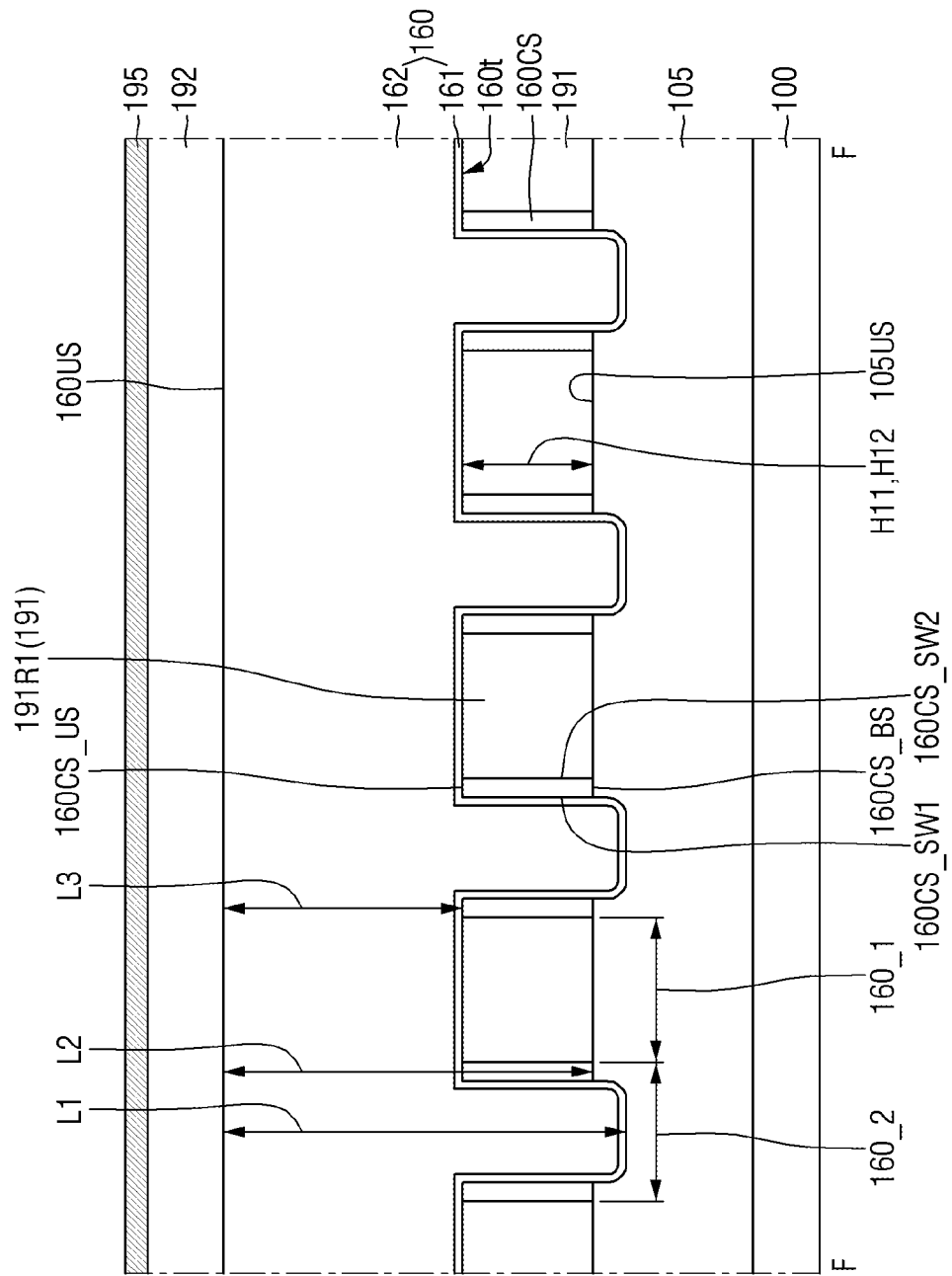

First connecting spacers 160CS may be disposed on the field insulating films 105, between the first and second active patterns AP1 and AP2 (FIG. 7). The first connecting spacers 160CS may be disposed on the field insulating films 105, between the first gate structures GS1 and the second gate structures GS2. The first connecting spacers 160CS may protrude from the top surfaces 105US of the field insulating films 105 in the third direction D3.

The first connecting spacers 160CS may be directly connected to the first gate spacers 140 and the second gate spacers 240. The first connecting spacers 160CS may include the same material as the first gate spacers 140 and the second gate spacers 240. For example, the first connecting spacers 160CS may include the same material as the first outer spacers 141 and the second outer spacers 241. The first connecting spacers 160CS may be spacers (140 and 240) that are not removed during the formation of the first gate separation structures 160.

The above description of the first gate separation structures 160 may be applicable to the first connecting spacers 160CS.

Figure 4:
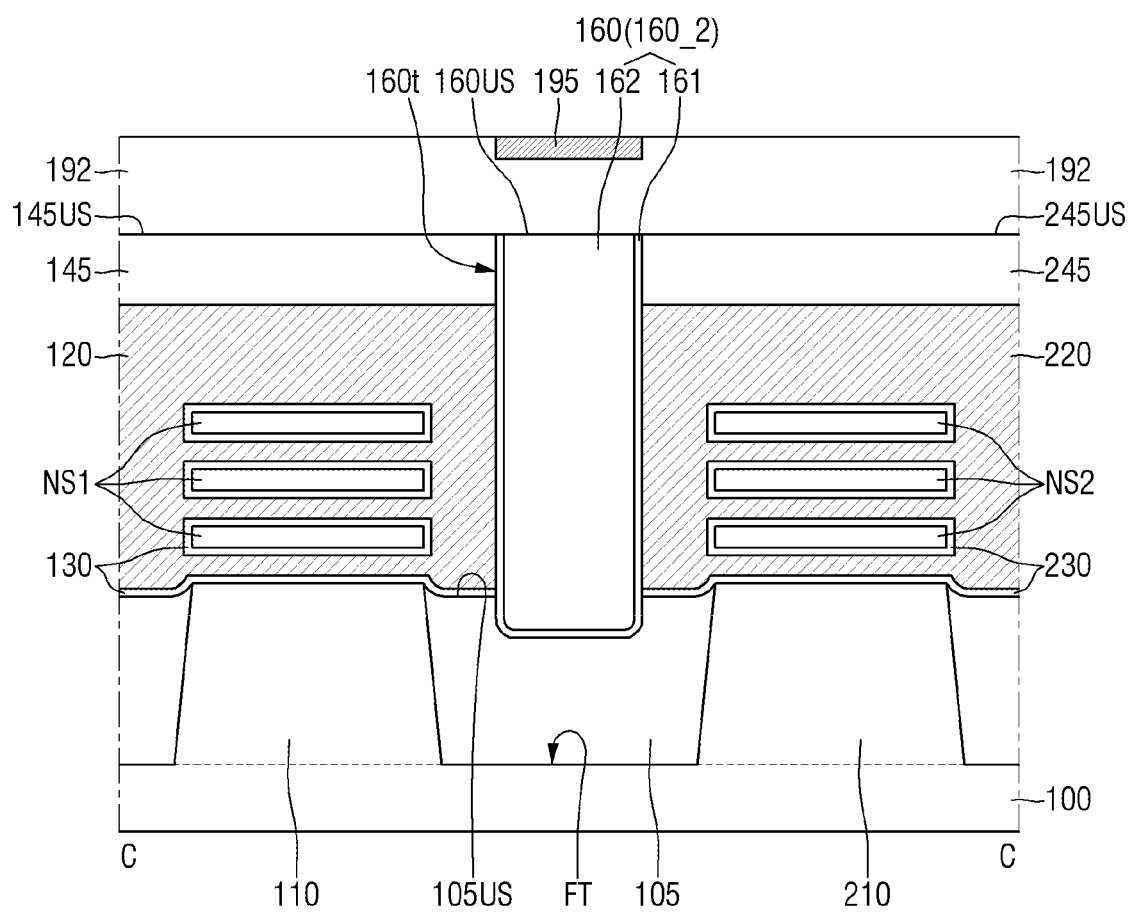
Figure 5:
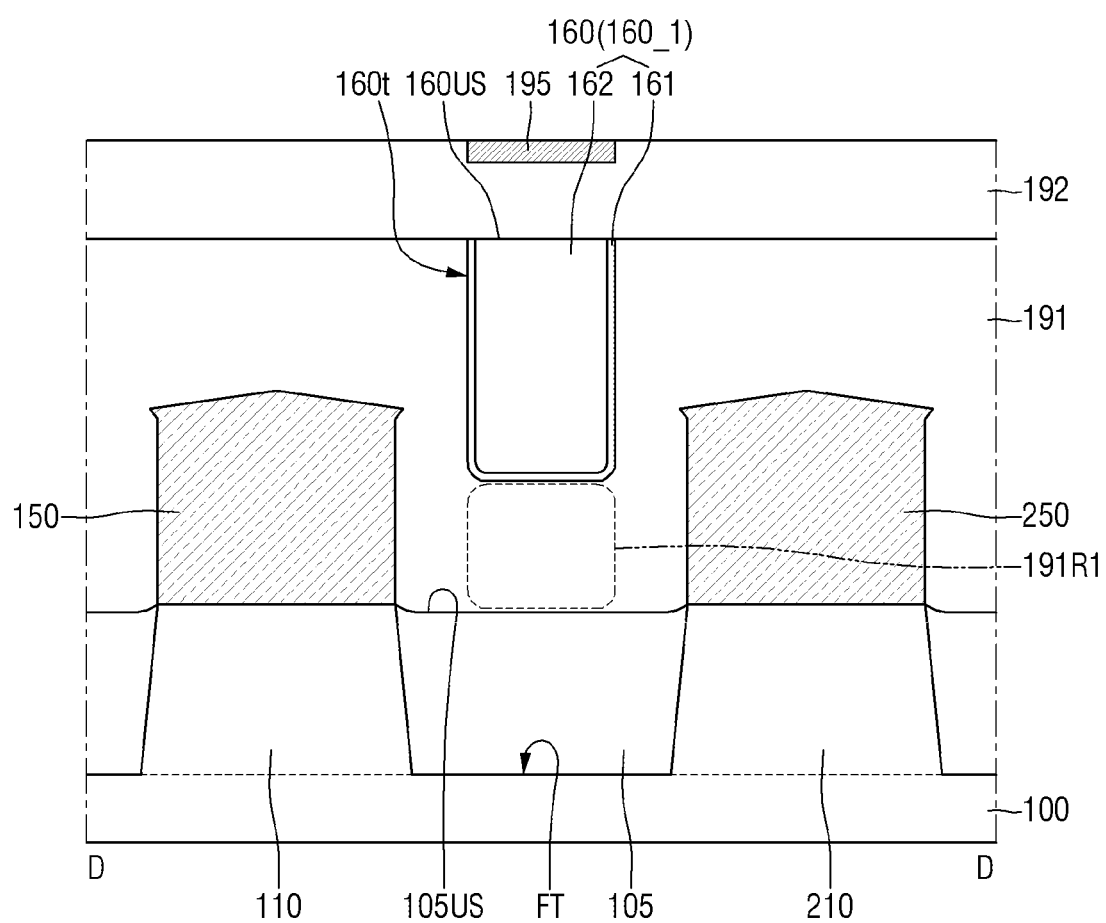

Referring to FIGS. 1 and 4, the first gate separation structures 160 may be disposed on the substrate 100. The first gate separation structures 160 may be disposed on the field insulating films 105, between the first and second active patterns AP1 and AP2. The first gate separation structures 160 may be disposed along the first direction D1.

The first gate separation structures 160 may be disposed to be spaced apart from one another in the second direction D2. The first gate separation structure 160 may be disposed between the first active patterns AP1 and the second active patterns AP2. The first gate structures GS1 may be disposed between the pair of adjacent first gate separation structures 160 in the second direction D2.

The first gate separation structures 160 may be disposed along the boundaries between standard cells. For example, the first gate separation structures 160 may be standard cell separation structures.

The first gate separation structures 160 may separate each pair of adjacent gate electrodes in the second direction D2. The first gate structures GS1 and the second gate structures GS2 may be separated by the first gate separation structures 160. That is, the first gate electrodes 120 and the second gate electrodes 220 may be separated from each other along the second direction D2 by one of the first gate separation structures 160. In other words, in a case where the first gate electrodes 120 and the second gate electrodes 220 have terminal parts with short sidewalls, the first gate separation structures 160 may be disposed between the terminal parts of the first gate electrodes 120 and the terminal parts of the second gate electrodes 220.

Figure 6:
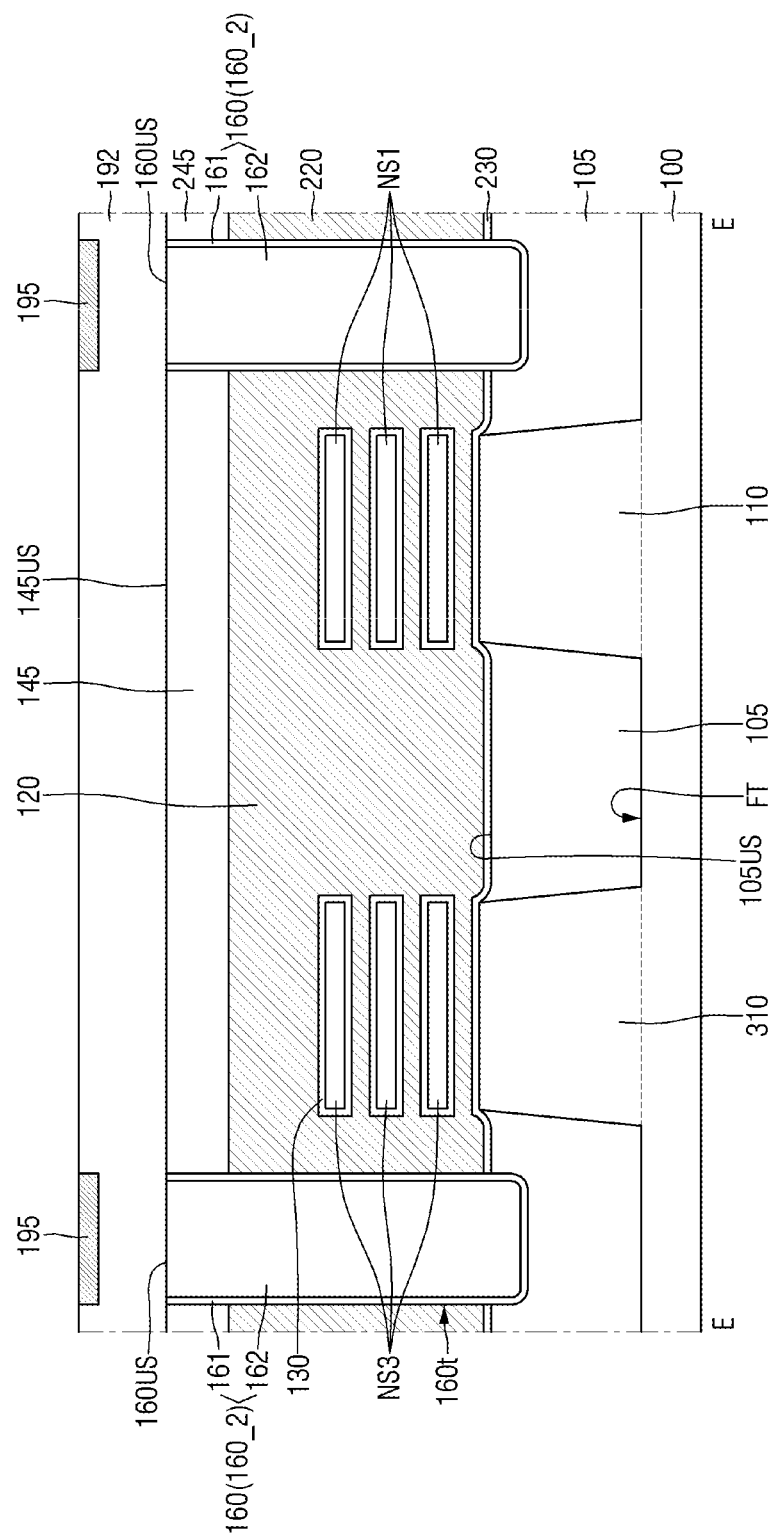

In a case where the first gate separation structures 160 include pairs of sidewalls that face the first gate electrodes 120 and the second gate electrodes 220, the first gate insulating films 130 and the second gate insulating films 230 do not extend along the pairs of sidewalls of the first gate separation structures 160 (FIG. 6).

The first gate separation structures 160 may be disposed on the field insulating films 105 between the first gate structures GS1 and the second gate structures GS2 that are aligned with the first gate structures GS1 in the second direction D2. Top surfaces 160US of the first gate separation structures 160 may be placed on the same plane as the top surfaces 145US of the first gate capping patterns 145 and the top surfaces 245US of the second gate capping patterns 245.

The first gate separation structures 160 may be disposed in the first interlayer insulating films 191 on the field insulating films 105. The top surfaces 160US of the first gate separation structures 160 may be placed on the same plane as the top surfaces of the first interlayer insulating films 191.

Referring to FIG. 7, the first connecting spacers 160CS may be disposed between the first gate separation structures 160 and the field insulating films 105. First recess insulating films 191R1 of the first interlayer insulating films 191 may be disposed between the first gate separation structures 160 and the field insulating films 105. The first recess insulating films 191R1 may be parts of the first interlayer insulating films 191 that overlap with the first gate separation structures 160 in the third direction D3.

The first connecting spacers 160CS may include bottom surfaces 160CS_BS, which face (e.g., contact) the top surfaces 105US of the field insulating films 105, first sidewalls 160CS_SW1, second sidewalls 160CS_SW2, and top surfaces 160CS_US. The first sidewalls 160CS_SW1 may be the sidewalls of the first connecting spacers 160CS that are opposite to the second sidewalls 160CS_SW2.

The second sidewalls 160CS_SW2 of the first connecting spacers 160CS may be covered by the first interlayer insulating films 191. That is, the first recess insulating films 191R1 may be covered by the second sidewalls 160CS_SW2 of the first connecting spacers 160CS. For example, when the first connecting spacers 160CS include pairs of connecting spacers that are adjacent to each other in the first direction D1, the first recess insulating film 191R1 may be disposed between the second sidewalls 160CS_SW2 of the pair of the first connecting spacers 160CS, e.g., each first recess insulating film 191R1 may be between the second sidewalls 160CS_SW2 of two first connecting spacers 160CS that are adjacent to each other in the first direction D1.

A height H11 of the first connecting spacers 160CS may be the same as a height H12 of the first recess insulating films 191R. A depth L3 (FIG. 7) from the top surfaces 160US of the first gate separation structures 160 to the top surfaces 160CS_US of the first connecting spacers 160CS may be greater than a depth L4 (FIG. 2A) from the top surfaces 145US of the first gate capping patterns 145 to the top surfaces of the first gate spacers 140.

The first gate separation structures 160 may be disposed in first gate separation trenches 160t, which are defined by the first interlayer insulating films 191, the field insulating films 105, and the first connecting spacers 160CS. The first gate separation structures 160 may fill the first gate separation trenches 160t. The first gate separation trenches 160t may separate the first gate structures GS1 and the second gate structures GS2.

The first gate separation trenches 160t may be defined by the first interlayer insulating films 191, the first sidewalls 160CS_SW1 of the first connecting spacers 160CS, the top surfaces 160CS_US of the first connecting spacers 160CS, and the top surfaces 105US of the field insulating films 105. The first gate separation trenches 160t may also be defined by the first gate electrodes 120, the second gate electrodes 220, the first gate capping patterns 145, and the second gate capping patterns 245.

The first gate separation structures 160 may include first gate separation liners 161 and first gate separation filling films 162. The first gate separation liners 161 may extend along the profiles of the first gate separation trenches 160t. The first gate separation filling films 162 may be disposed on the first gate separation liners 161 and may fill the first gate separation trenches 160t.

The first gate separation liners 161 may extend along the first interlayer insulating films 191, the first sidewalls 160CS_SW1 of the first connecting spacers 160CS, the top surfaces 160CS_US of the first connecting spacers 160CS, and the top surfaces 105US of the field insulating films 105. The first gate separation liners 161 may extend along the first gate electrodes 120, the second gate electrodes 220, the first gate capping patterns 145, and the second gate capping patterns 245. The first gate separation liners 161 may be in contact with the first connecting spacers 160CS, the field insulating films 105, the first gate electrodes 120, and the second gate electrodes 220.

The first sidewalls 160CS_SW1 of the first connecting spacers 160CS may face the first gate separation structures 160. The second sidewalls 160CS_SW2 of the first connecting spacers 160CS may face the first recess insulating films 191R1. The first recess insulating films 191R1 may be disposed between the first connecting spacers 160CS, particularly, between the second sidewalls 160CS_SW2 of the first connecting spacers 160CS.

During etching for forming the first gate separation trenches 160t, parts of the field insulating films 105 may be etched. As a result, the top surfaces 105US of the field insulating films 105 that define the first gate separation trenches 160t may become lower than the bottom surfaces 160CS_BS of the first connecting spacers 160CS.

Parts of the first gate separation structures 160 may be located lower than the bottom surfaces 160CS_BS of the first connecting spacers 160CS. For example, parts of the first gate separation liners 161 may be located lower than the bottom surfaces 160CS_BS of the first connecting spacers 160CS. For example, as illustrated in FIG. 7, a depth L1 from the top surfaces 160US of the first gate separation structures 160 to the lowermost parts of the first gate separation structures 160 may be greater than a depth L2 from the top surfaces 160US of the first gate separation structures 160 to the bottom surfaces 160CS_BS of the first connecting spacers 160CS.

The first gate separation structures 160 may include first portions 160_1 and second portions 160_2. The first portions 160_1 of the first gate separation structures 160 are parts of the first gate separation structures 160 that overlap with the first interlayer insulating films 191 in the third direction D3. The second portions 160_2 of the first gate separation structures 160 are parts of the first gate separation structures 160 that do not overlap with the first interlayer insulating films 191 in the third direction D3. As illustrated in FIG. 1, the width, in the first direction D1, of the first gate separation structures 160 may be greater than the width, in the first direction D1, of, e.g., each of, the first gate structures GS1.

The first gate separation liners 161 may function as barriers that prevent oxygen from diffusing into the first gate electrodes 120 and the second gate electrodes 220. The first gate separation liners 161 may include, e.g., a material capable of preventing the diffusion of oxygen.

The first gate separation liners 161 may include, e.g., at least one of a polycrystalline semiconductor material, aluminum oxide (AlO), aluminum nitride (AlN), silicon nitride (SiN), silicon oxycarbide (SiOC), silicon oxycarbide (SiOCN), silicon carbide (SiC), silicon lanthanum oxide (LaO), and a high-k insulating material, but the present disclosure is not limited thereto. The high-k insulating material may be one of the aforementioned exemplary materials of the first gate insulating films. The first gate separation filling films 162 may include, e.g., silicon oxide or an oxide-based insulating material.

The second interlayer insulating film 192 may be disposed on the first interlayer insulating films 191. The second interlayer insulating film 192 may include, e.g., silicon oxide, silicon nitride, silicon oxynitride, flowable oxide (FOX), Tonen Silazene (TOSZ), undoped silicate glass (USG), borosilicate glass (BSG), phosphosilicate glass (PSG), borophosphosilicate glass (BPSG), plasma-enhanced tetra ethyl ortho silicate (PETEOS), fluoride silicate glass (FSG), carbon-doped silicon oxide (CDO), xerogel, aerogel, amorphous fluorinated carbon, organo silicate glass (OSG), parylene, bis-benzocyclobutene (BCB), SiLK, polyimide, a porous polymeric material, or a combination thereof, but the present disclosure is not limited thereto.

The wire lines 195 may be disposed in the second interlayer insulating film 192. The wire lines 195 may extend in the first direction D1 along the first gate separation structures 160. For example, as illustrated in FIG. 4, the wire lines 195 may overlap top surfaces 160US of the first gate separation structures 160, while being vertically spaced apart therefrom via the second interlayer insulating film 192. In another example, the wire lines 195 may be in contact with the top surfaces 160US of the first gate separation structures 160.

For example, the wire lines 195 may be power lines that provide power to integrated circuits (ICs) including the first active pattern AP1, the second active pattern AP2, the first gate electrodes 120, and the second gate electrodes 220. The wire lines 195 may include, e.g., at least one of a metal, a metal alloy, a conductive metal nitride, and a 2D material. For example, wires may be further disposed to transmit signals to the ICs including the first active pattern AP1, the second active pattern AP2, the first gate electrodes 120, and the second gate electrodes 220.

Figure 10:
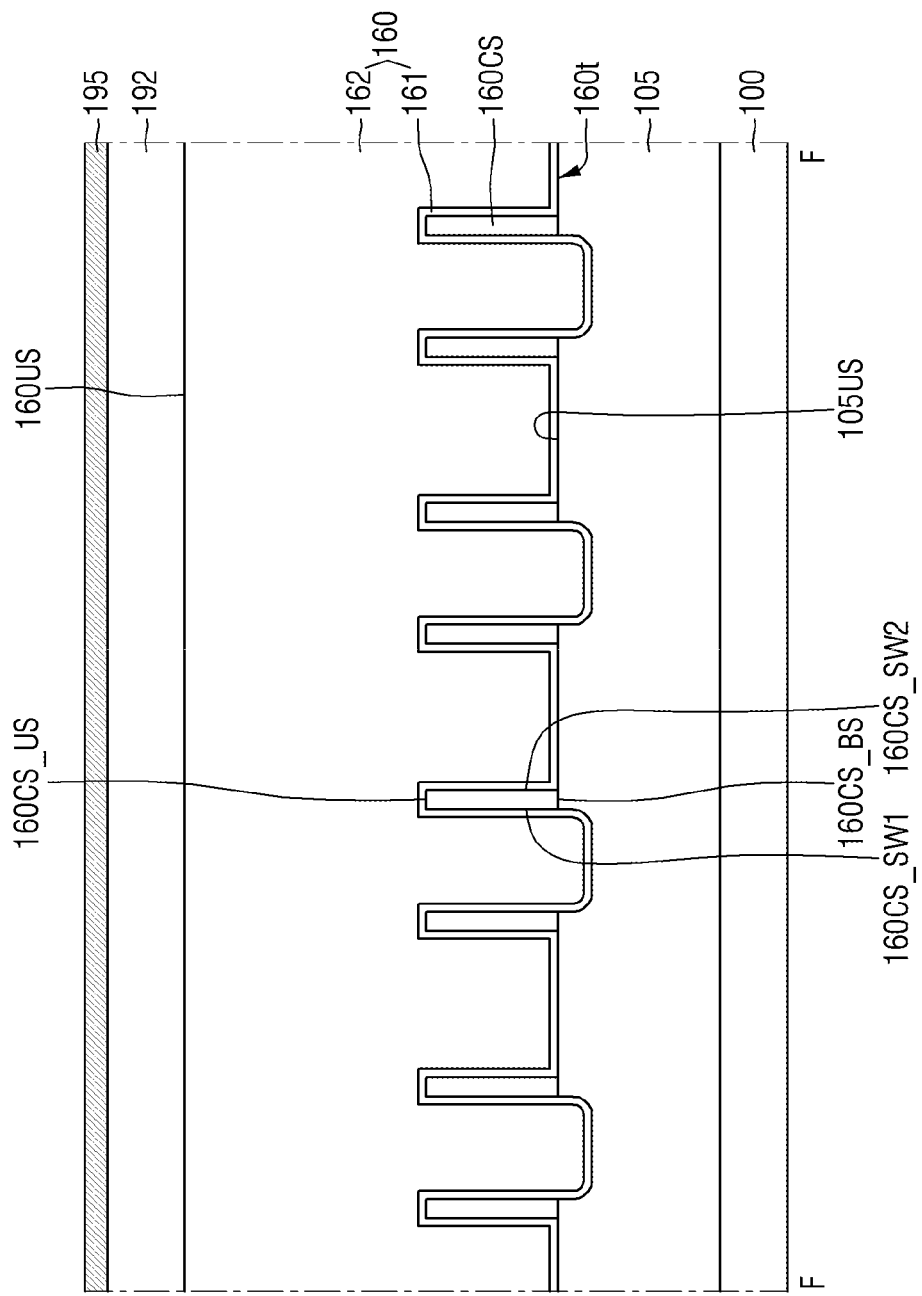
Figure 11:
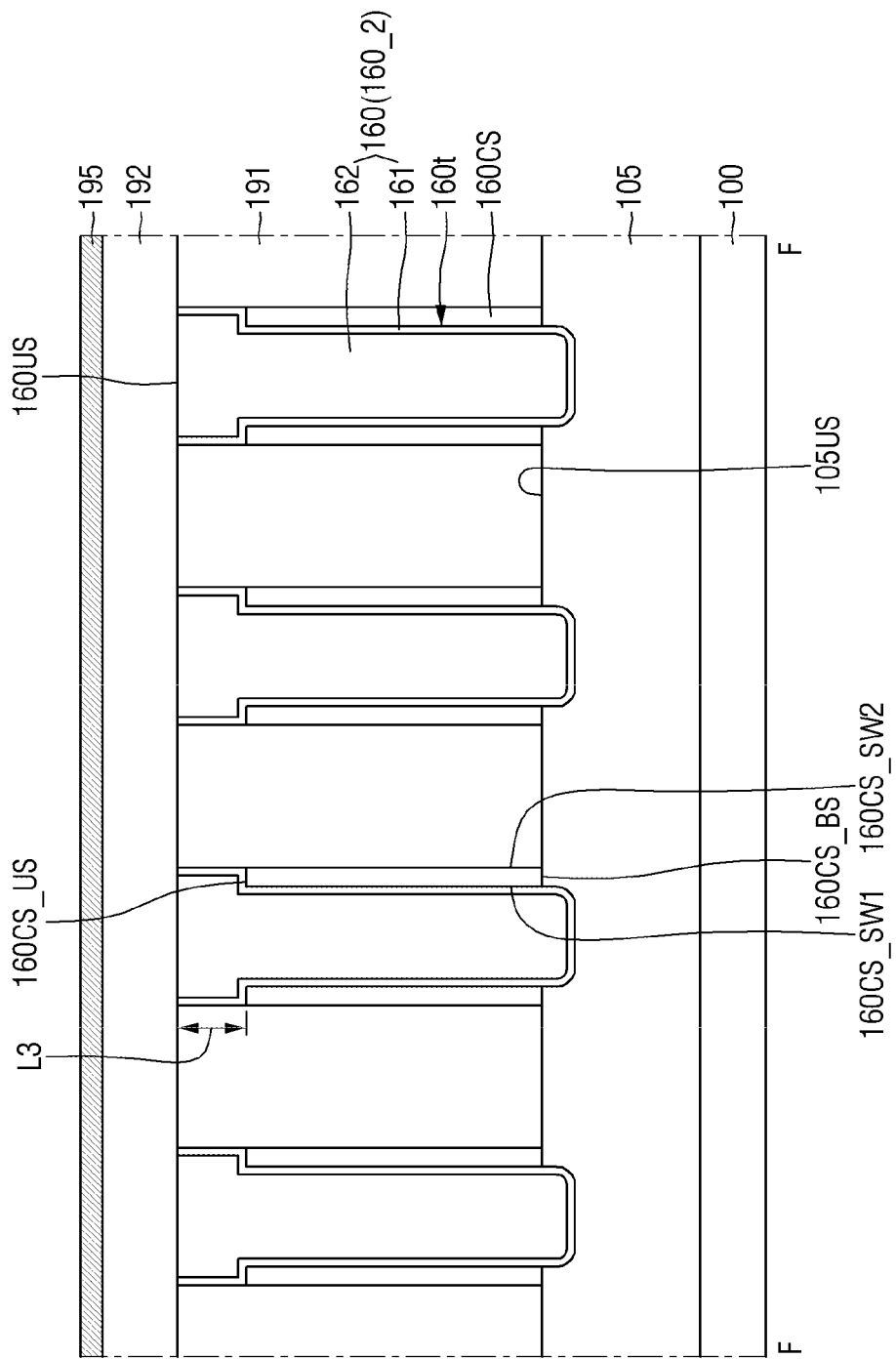
Figure 12:
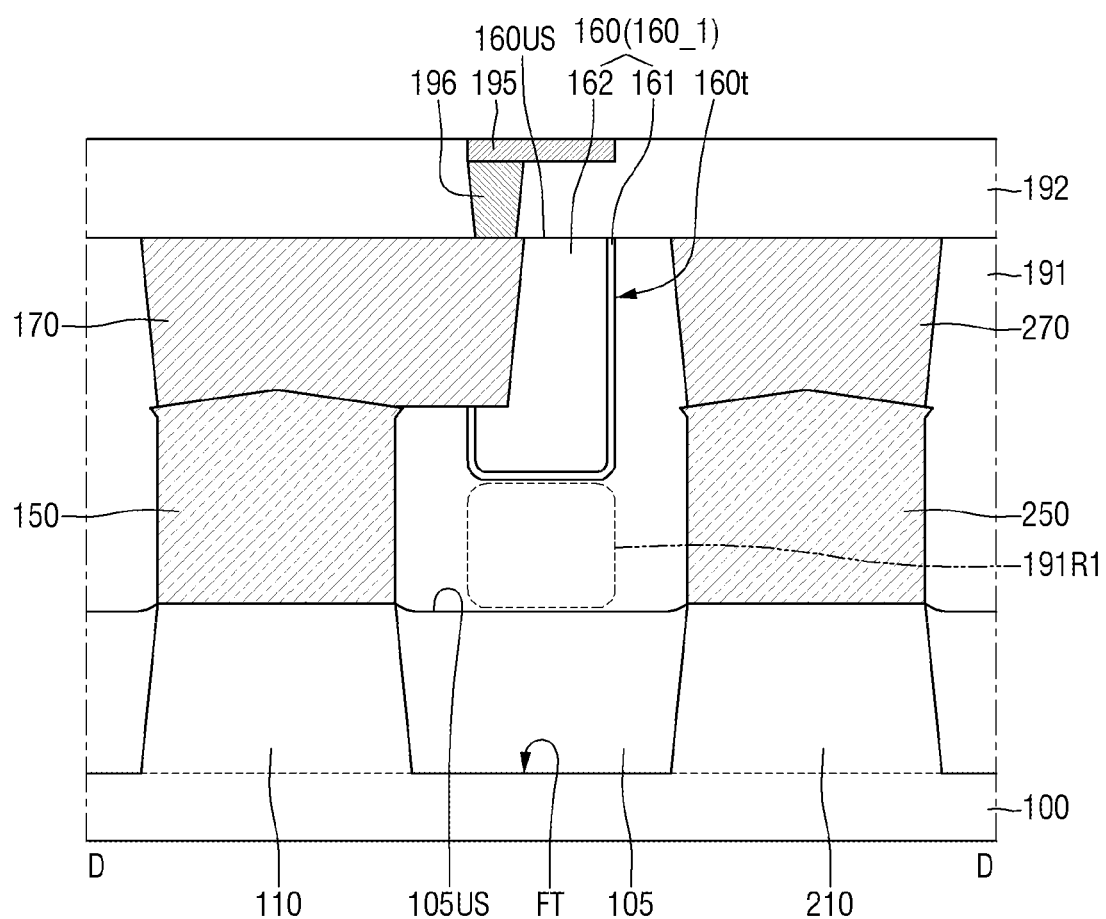

FIGS. 8 through 12 are cross-sectional views of a semiconductor device according to some embodiments of the present disclosure. For convenience, the semiconductor device of FIGS. 8 through 12 will hereinafter be described, focusing mainly on the differences with respect to the semiconductor device of FIGS. 1 through 7. FIGS. 8 through 11 are cross-sectional views taken along line F-F of FIG. 1, and FIG. 12 is a cross-sectional view taken along line D-D of FIG. 1.

Figure 8:
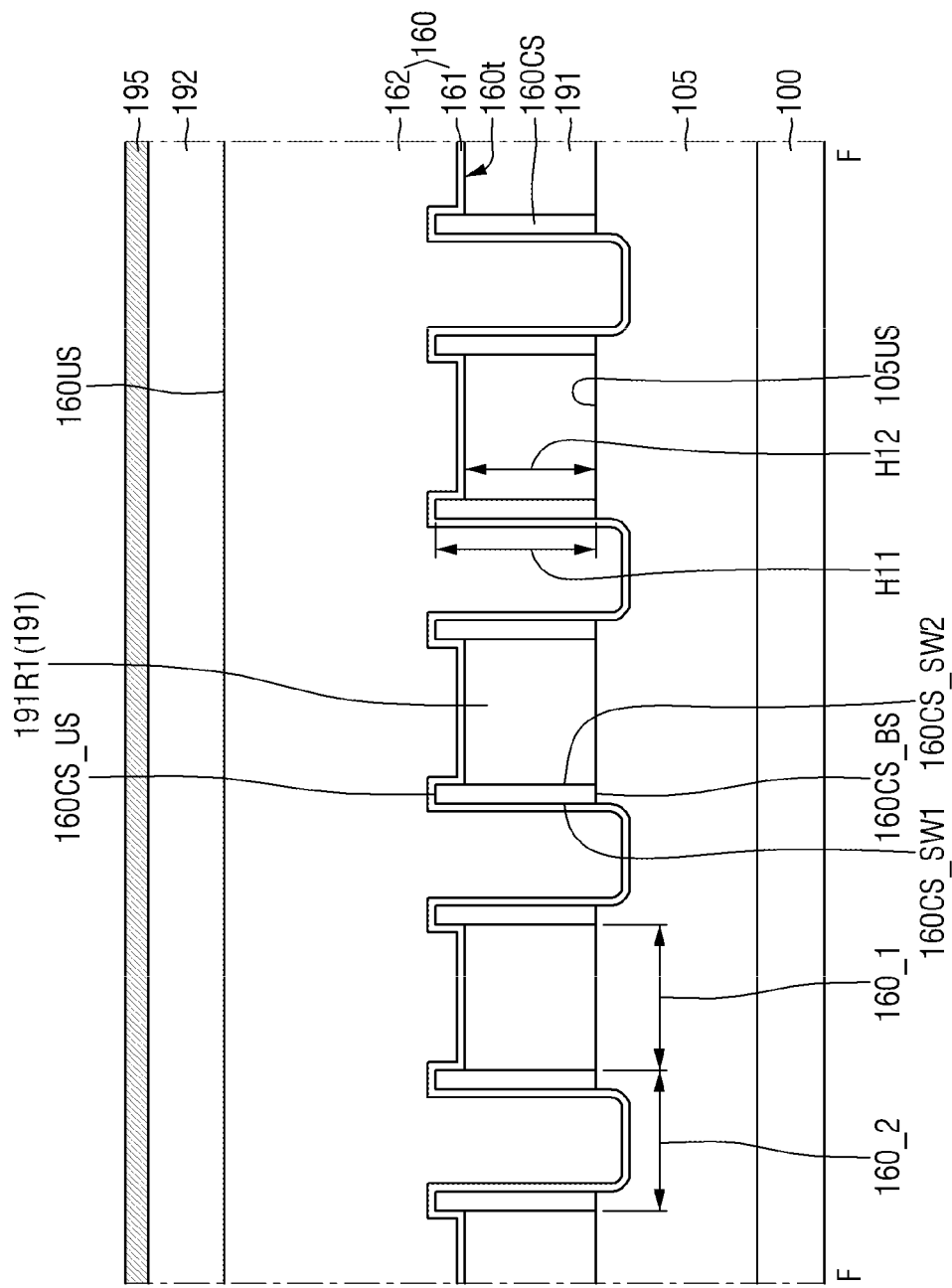
FIGS. 8 through 12 are cross-sectional views of a semiconductor device according to some embodiments of the present disclosure.

Referring to FIG. 8, a height H11 of the first connecting spacers 160CS may be greater than a height H12 of the first recess insulating films 191R1. Parts of the first gate separation trenches 160t may be defined by the second sidewalls 160CS_SW2 of the first connecting spacers 160CS. Parts the of first gate separation liners 161 may extend along the second sidewalls 160CS_SW2 of the first connecting spacers 160CS. Parts of the second sidewalls 160CS_SW2 of the first connecting spacers 160CS may be covered by the first recess insulating films 191R1, and the rest of the second sidewalls 160CS_SW2 of the first connecting spacers 160CS may be covered by the first gate separation liners 161.

Figure 9:
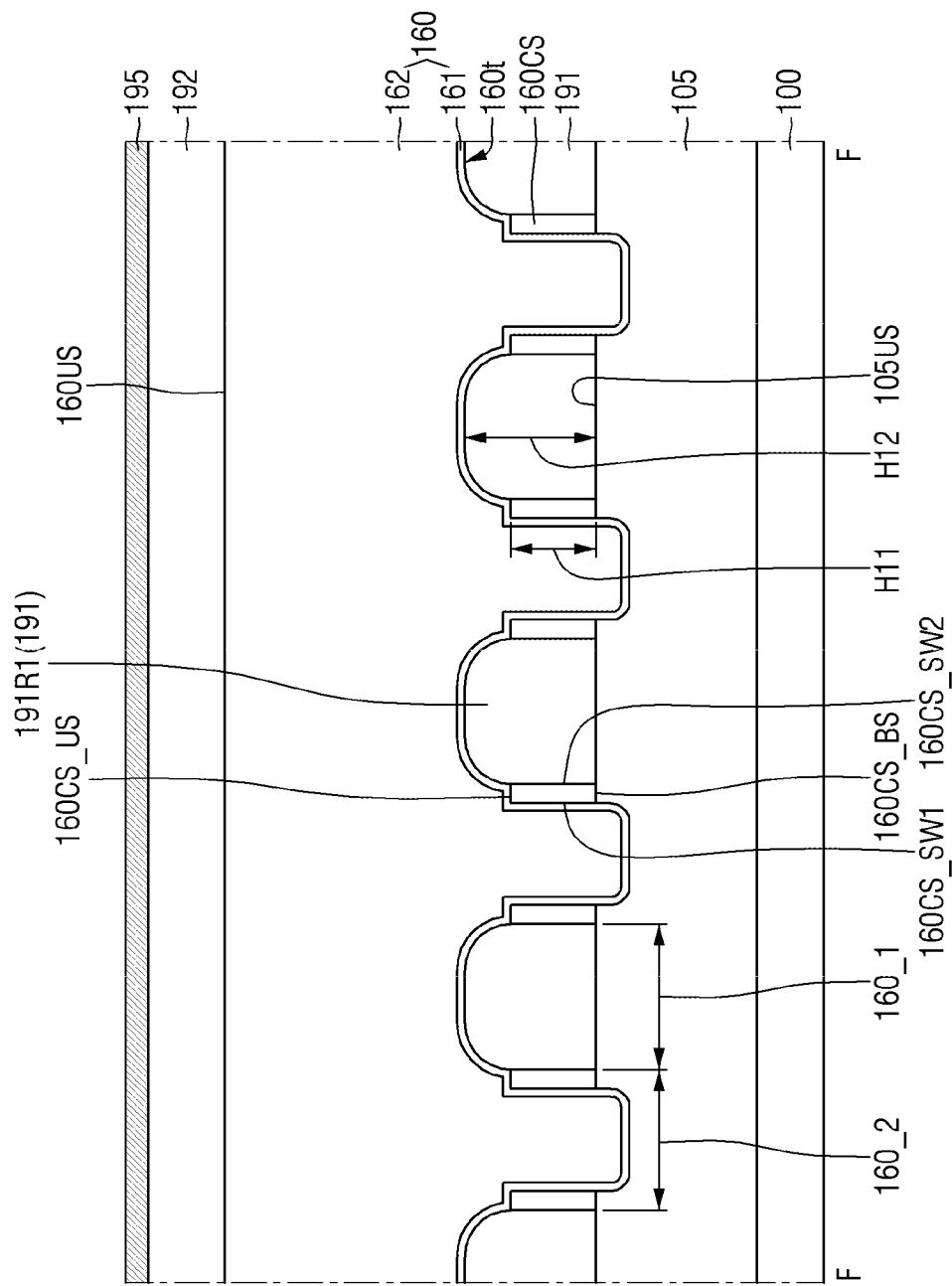

Referring to FIG. 9, a height H11 of the first connecting spacers 160CS may be smaller than a height H12 of the first recess insulating films 191R1. The first interlayer insulating films 191 may protrude upwardly from the top surfaces 160CS_US of the first connecting spacers 160CS. That is, parts of the first recess insulating films 191R1 may protrude upwardly from the top surfaces 160CS_US of the first connecting spacers 160CS.

Referring to FIG. 10, the first gate separation liners 161 may extend along the first sidewalls 160CS_SW1 of the first connecting spacers 160CS, the top surfaces 160CS_US of the first connecting spacers 160CS, and the second sidewalls 160CS_SW2 of the first connecting spacers 160CS. The first gate separation liners 161 may cover the entire first sidewalls 160CS_SW1 and the entire second sidewalls 160CS_SW2 of the first connecting spacers 160CS.

The top surfaces 105US of field insulating films 105 on the first sides of the first connecting spacers 160CS may be lower than the bottom surfaces 160CS_BS of the first connecting spacers 160CS, and the top surfaces 105US of field insulating films 105 on the second sides of the first connecting spacers 160CS may be on the same plane as the bottom surfaces 160CS_BS of the first connecting spacers 160CS. However, the present disclosure is not limited to this. Alternatively, the top surfaces 105US of the field insulating films 105 on the second sides of the first connecting spacers 160CS may also be lower than the bottom surfaces 160CS_BS of the first connecting spacers 160CS.

Referring to FIG. 11, the first gate separation structures 160 may be separated by the first interlayer insulating films 191. The first gate separation structures 160 and the first interlayer insulating films 191 may be alternately arranged in the first direction D1.

The top surfaces of the first interlayer insulating films 191 between the second sidewalls 160CS_SW2 of the first connecting spacers 160CS may be placed on the same plane as the top surfaces 160US of the first gate separation structures 160. In other words, the first gate separation structures 160 may include only portions that do not overlap with the first interlayer insulating films 191 in the third direction D3, i.e., the second portions 160_2 of FIG. 7.

Referring to FIGS. 2 and 11, the depth L3 from the top surfaces 160US of the first gate separation structures 160 to the top surfaces 160CS_US of the first connecting spacers 160CS may be the same as, or greater than, the depth L4 from the top surfaces 145US of the first gate capping patterns 145 to the top surfaces of first gate spacers 140. The width, in the first direction D1, of the first gate separation structures 160 may be the same as the width, in the first direction D1, of the first gate structures GS1.

Referring to FIG. 12, the semiconductor device according to some embodiments of the present disclosure may further include first source/drain contacts 170 on the first source/drain patterns 150 and second source/drain contacts 270 on the second source/drain patterns 250. For example, the first source/drain contacts 170 may be disposed between the first gate structures GS1 of FIG. 2A, and the second source/drain contacts 270 may be disposed between the second gate structures GS2 of FIG. 3.

The first source/drain contacts 170 may be connected to the first source/drain patterns 150, and the second source/drain contacts 270 may be connected to the second source/drain patterns 250. The top surfaces of the first source/drain contacts 170 and the top surfaces of the second source/drain contacts 270 may be placed on the same plane as the top surfaces of the first interlayer insulating films 191 and the top surfaces 160US of the first gate separation structures 160.

At least one of the first source/drain contacts 170 on the first source/drain patterns 150 may be connected to the wire lines 195. Wire plugs 196 may connect the first source/drain contacts 170 and the wire lines 195. The wire plugs 196 may be disposed in the second interlayer insulating films 192.

Parts of the first source/drain contacts 170 may be disposed in the first gate separation structures 160. The first source/drain contacts 170 may not penetrate the first gate separation structures 160 in the second direction D2.

The first source/drain contacts 170, the second source/drain contacts 270, and the wire plugs 196 may include, e.g., at least one of a metal, a metal alloy, a conductive metal nitride, and a 2D material.

Figure 13:
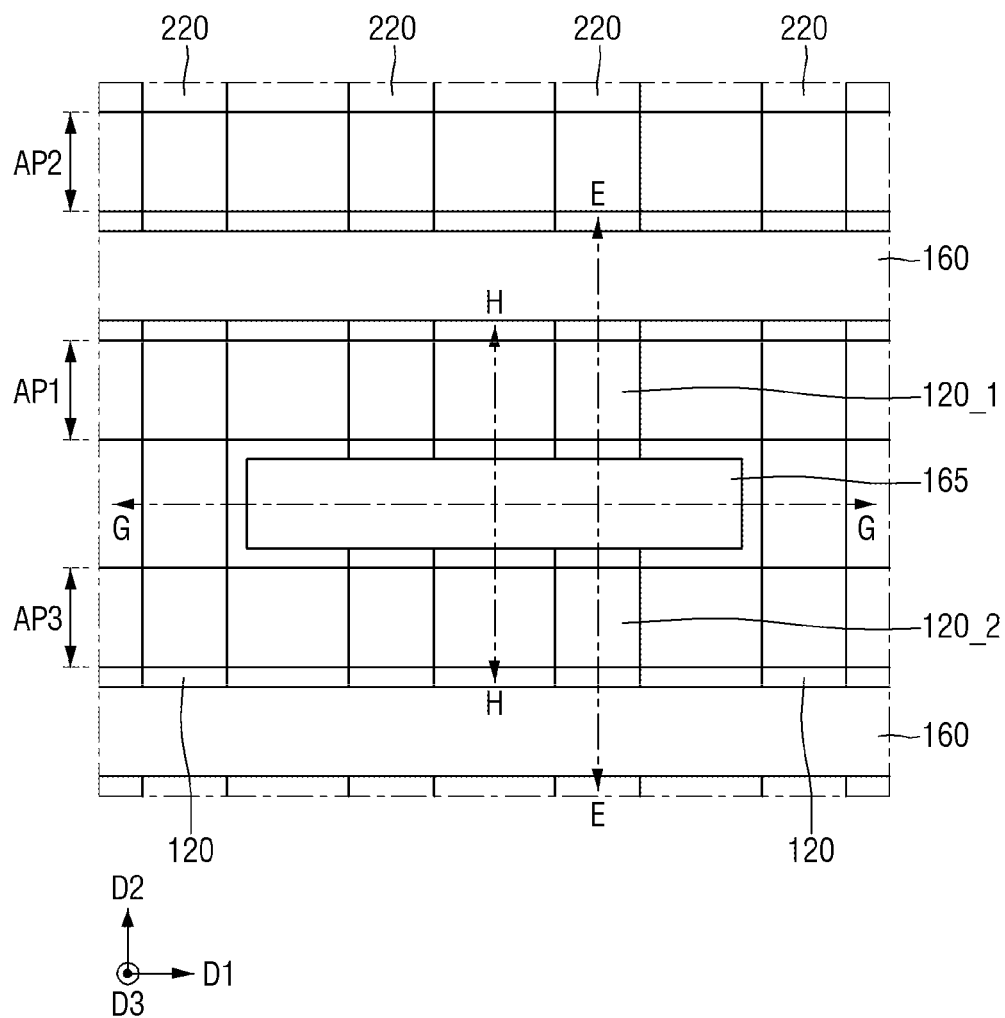
FIGS. 13 through 16 are layout views or cross-sectional views of a semiconductor device according to some embodiments of the present disclosure.
Figure 14:
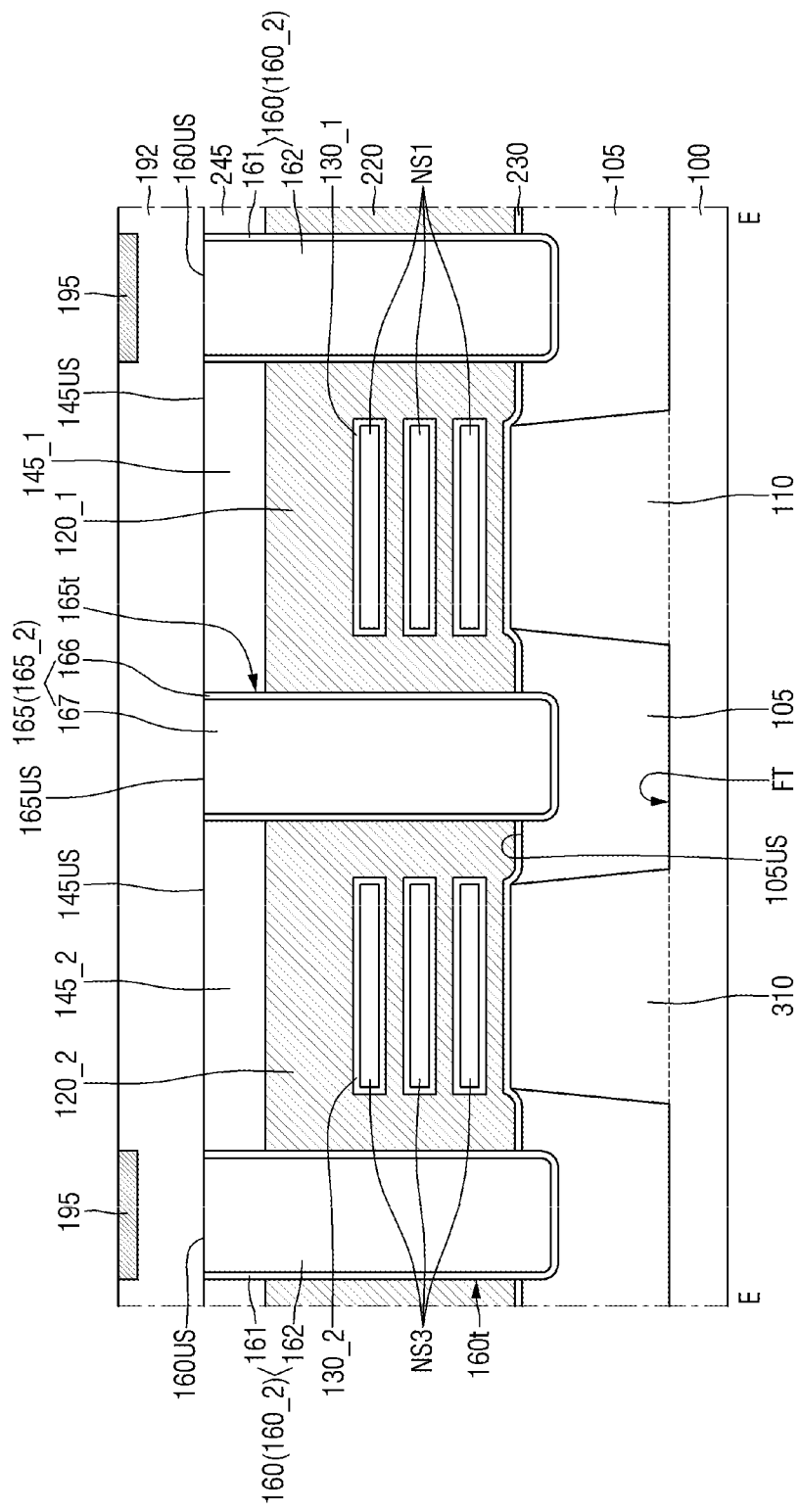
Figure 15:
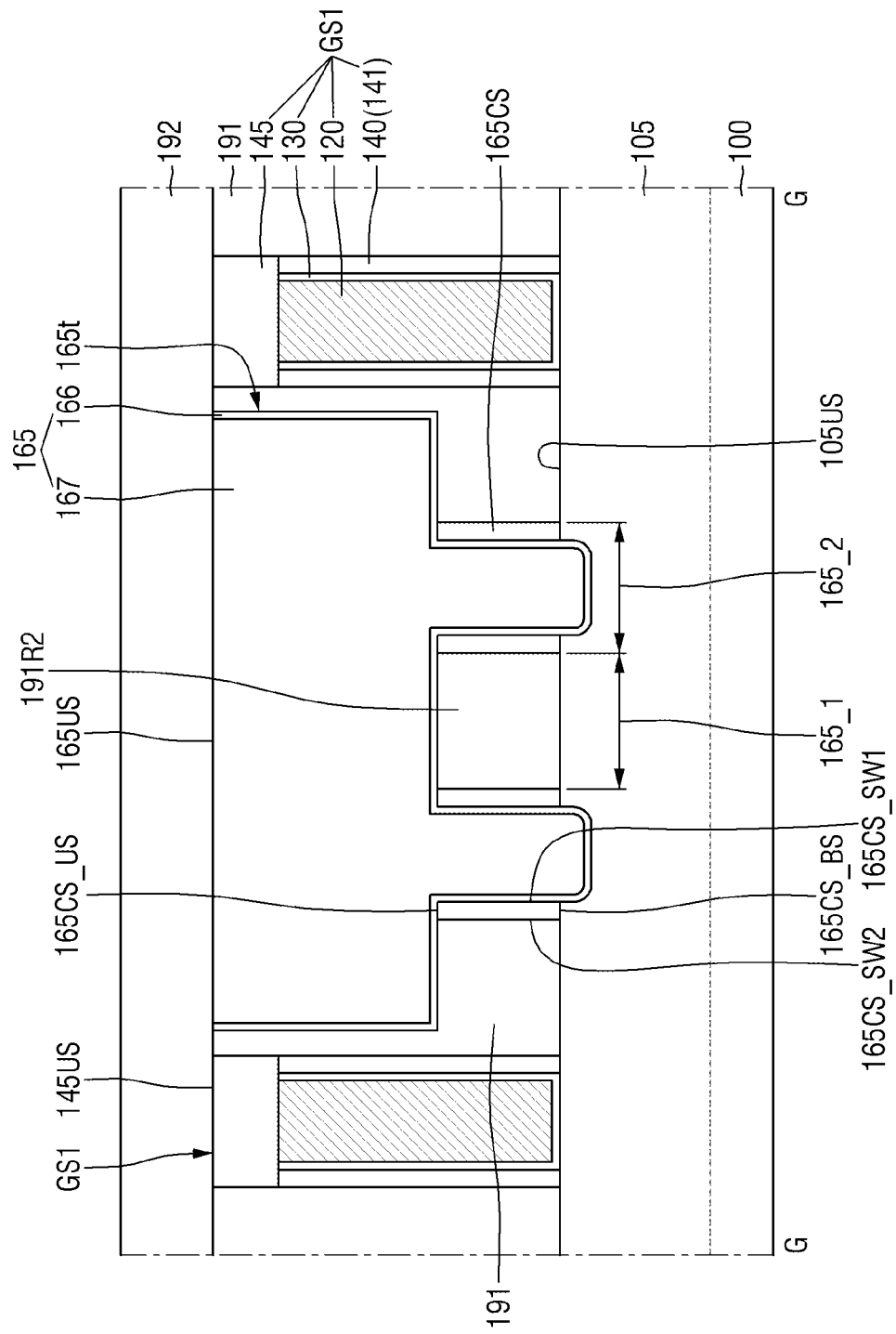
Figure 16:
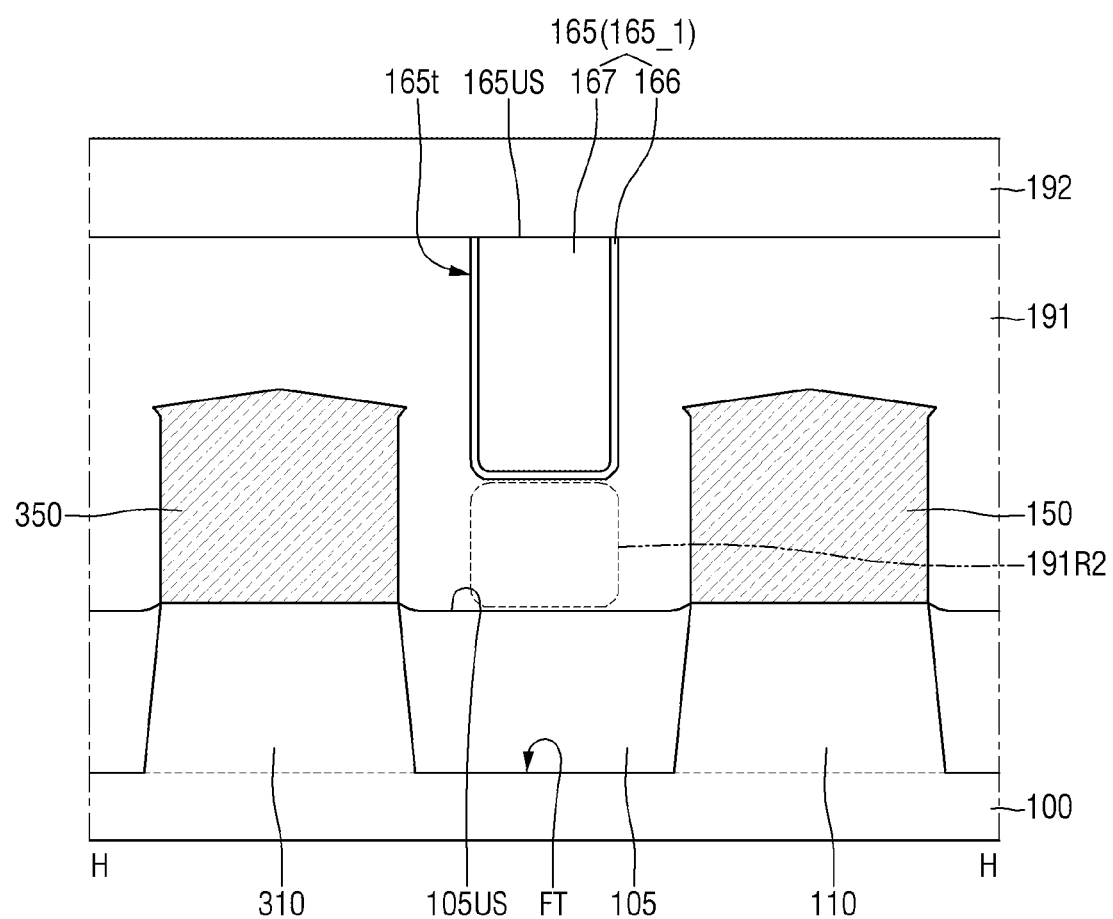

FIGS. 13 through 16 are layout views or cross-sectional views of a semiconductor device according to some embodiments of the present disclosure. For convenience, the semiconductor device of FIGS. 13 through 16 will hereinafter be described, focusing mainly on the differences with respect to the semiconductor device of FIGS. 1 through 7. FIG. 13 is a layout view of a semiconductor device according to some embodiments of the present disclosure, and FIGS. 14, 15, and 16 are cross-sectional views along lines E-E, G-G, and H-H of FIG. 13, respectively.

Referring to FIGS. 13 through 16, the semiconductor device according to some embodiments of the present disclosure may further include a second gate separation structure 165, which is disposed between the first gate separation structures 160. The second gate separation structure 165 may be disposed on the substrate 100. The second gate separation structure 165 may be disposed on the field insulating film 105.

The second gate separation structure 165 may be disposed between the first and third active patterns AP1 and AP3. The second gate separation structure 165 may be disposed between the first and third lower patterns 110 and 310.

The top surface 165US of the second gate separation structure 165 may be placed on the same plane as the top surfaces 160US of the first gate separation structures 160. The second gate separation structure 165 may be disposed in a standard cell.

For example, the width, in the first direction D1, of the first gate separation structures 160 may be greater than the width, in the first direction D1, of the second gate separation structure 165.

The second gate separation structure 165 may be disposed between the first gate structures GS1 that intersect the first and third active patterns AP1 and AP3. For example, the second gate separation structure 165 may not be in contact with the first gate structures GS1.

The second gate separation structure 165 may separate some of the first gate electrodes 120 into sub gate electrodes 120_1 and 1202, which are aligned with each other in the second direction D2. For example, as illustrated in FIGS. 13 and 14, the second gate separation structure 165 may separate at least one of the first gate electrodes 120 into first and second sub gate electrodes 120_1 and 120_2 to be aligned with each other in the second direction D2. As the first gate structures GS1 are separated by the second gate separation structure 165, the first and second sub gate electrodes 120_1 and 1202 may be formed.

The first sub gate electrode 120_1 may intersect the first active pattern AP1. The first sub gate electrode 120_1 may be disposed on the first lower pattern 110 and may surround first sheet patterns NS1. The second sub gate electrode 120_2 may intersect the third active pattern AP3.

The second sub gate electrode 1202 may be disposed on the third lower pattern 310 and may surround third sheet patterns NS3.

First sub gate insulating films 130_1 may extend along the circumferences of the first sheet patterns NS1 and the top surface of the first lower pattern 110. Second sub gate insulating films 130_2 may extend along the circumferences of the third sheet patterns NS3 and the top surface of the third lower pattern 310. A first sub gate capping pattern 1451 may be disposed on the first sub gate electrode 120_1, and a second sub gate capping pattern 145_2 may be disposed on the second sub gate electrode 120_2. Top surfaces 145US of the first and second sub gate capping patterns 145_1 and 145_2 may be placed on the same plane as the top surface 165US of the second gate separation structure 165.

The first sub gate electrode 120_1, the first sub gate insulating films 130_1, and the first sub gate capping pattern 145_1 may be included in a first sub gate structure. The second sub gate electrode 120_2, the second sub gate insulating films 1302, and the second sub gate capping pattern 145_2 may be included in a second sub gate structure. The first and second sub gate structures may be separated by the second gate separation structure 165. The first and second sub gate structures may be between the first gate structures GS1 that intersect the first and second active patterns AP1 and AP3.

The first source/drain pattern 150 may be disposed on the first lower pattern 110. The first source/drain pattern 150 may be connected to stacks of the first sheet patterns NS1 that are adjacent to each other in the first direction D1. A third source/drain pattern 350 may be disposed on the third lower pattern 310. The third source/drain pattern 350 may be connected to stacks of the third sheet patterns NS3 that are adjacent to each other in the first direction D1. The second gate separation structure 165 may be disposed between the first and third source/drain patterns 150 and 350.

Second connecting spacers 165CS may be disposed on the field insulating film 105 between the first and third active patterns AP1 and AP3. The second connecting spacers 165CS may be disposed between a pair of adjacent first gate structures in the first direction D1. The second connecting spacers 165CS may protrude from the top surface 105US of the field insulating film 105 in the third direction D3.

The second connecting spacers 165CS may be the first gate spacers 140 that are not removed during the formation of the second gate separation structure 165. Thus, an even number of the second connecting spacers 165CS may be disposed between the pair of adjacent first gate structures GS1 in the first direction D1.

The above descriptions of the first connecting spacers 160CS and the first gate separation structures 160 of FIGS.

1 through 7 may be applicable to the second connecting spacers 165CS and the second gate separation structure 165.

The second connecting spacers 165CS may be disposed between the second gate separation structure 165 and the field insulating film 105. A second recess insulating film 191R2 of the first interlayer insulating film 191 may be disposed between the second gate separation structure 165 and the field insulating film 105. The second recess insulating film 191R2 may be part of the first interlayer insulating film 191 that overlaps with the second gate separation structure 165 in the third direction D3.

The second connecting spacers 165CS may include bottom surfaces 165CS_BS, which face the top surface 105US of the field insulating film 105, first sidewalls 165CS_SW1, second sidewalls 165CS_SW2, and top surfaces 165CS_US. The first sidewalls 165CS_SW1 may be the sidewalls of the second connecting spacers 165CS that are opposite to the second sidewalls 165CS_SW2. The second recess insulating film 191R2 may cover the second sidewalls 160CS_SW2 of the first connecting spacers 160.

The second gate separation structure 165 may be disposed in a second gate separation trench 165t, which is defined by the first interlayer insulating film 191, the field insulating film 105, and the second connecting spacers 165CS. The second gate separation structure 165 may fill the second gate separation trench 165t. The second gate separation trench 165t may separate the first and second sub gate electrodes 120_1 and 120_2.

The second gate separation trench 165t may be defined by the first interlayer insulating film 191, the first sidewalls 165CS_SW1 of the second connecting spacers 165CS, the top surfaces 165CS_US of the second connecting spacers 165CS, and the top surface 105US of the field insulating film 105.

The second gate separation structure 165 may include a second gate separation liner 166 and a second gate separation filling film 167. The second gate separation liner 166 may extend along the profile of the second gate separation trench 165t. The second gate separation liner 166 may extend along the first interlayer insulating film 191, the first sidewalls 165CS_SW1 of the second connecting spacers 165CS, the top surfaces 165CS_US of the second connecting spacers 165CS, and the top surface 105US of the field insulating film 105. The second gate separation filling film 167 may be on the second gate separation liner 166 and may fill the second gate separation trench 165t.

The top surface 105US of the field insulating film 105, which defines the second gate separation trench 165t, may be lower than the bottom surfaces 165CS_BS of the second connecting spacers 165CS. Part of the second gate separation liner 166 may be lower than the bottom surfaces 165CS_BS of the second connecting spacers 165CS.

The second gate separation structure 165 may include a first portion 165_1 and a second portion 165_2. The first portion 165_1 of the second gate separation structure 165 may be part of the second gate separation structure 165 that overlaps with the first interlayer insulating film 191 in the third direction D3. The second portion 165_2 of the second gate separation structure 165 may be part of the second gate separation structure 165 that does not overlap with the first interlayer insulating film 191 in the third direction D3.

The above descriptions of the materials of the first gate separation liners and filling films 161 and 162 of FIGS. 1 through 7 may be applicable to the materials of the second gate separation liner 166 and the second gate separation filling film 167.

For example, during the formation of the first connecting spacers 160CS and the first gate separation structures 160, the second connecting spacers 165CS and the second gate separation structure 165 may be formed. Thus, the second connecting spacers 165CS and the second gate separation structure 165 may have similar shapes, along the first direction D1, to the first connecting spacers 160CS and the first gate separation structures 160 of FIGS. 8 through 11.

Figure 17:
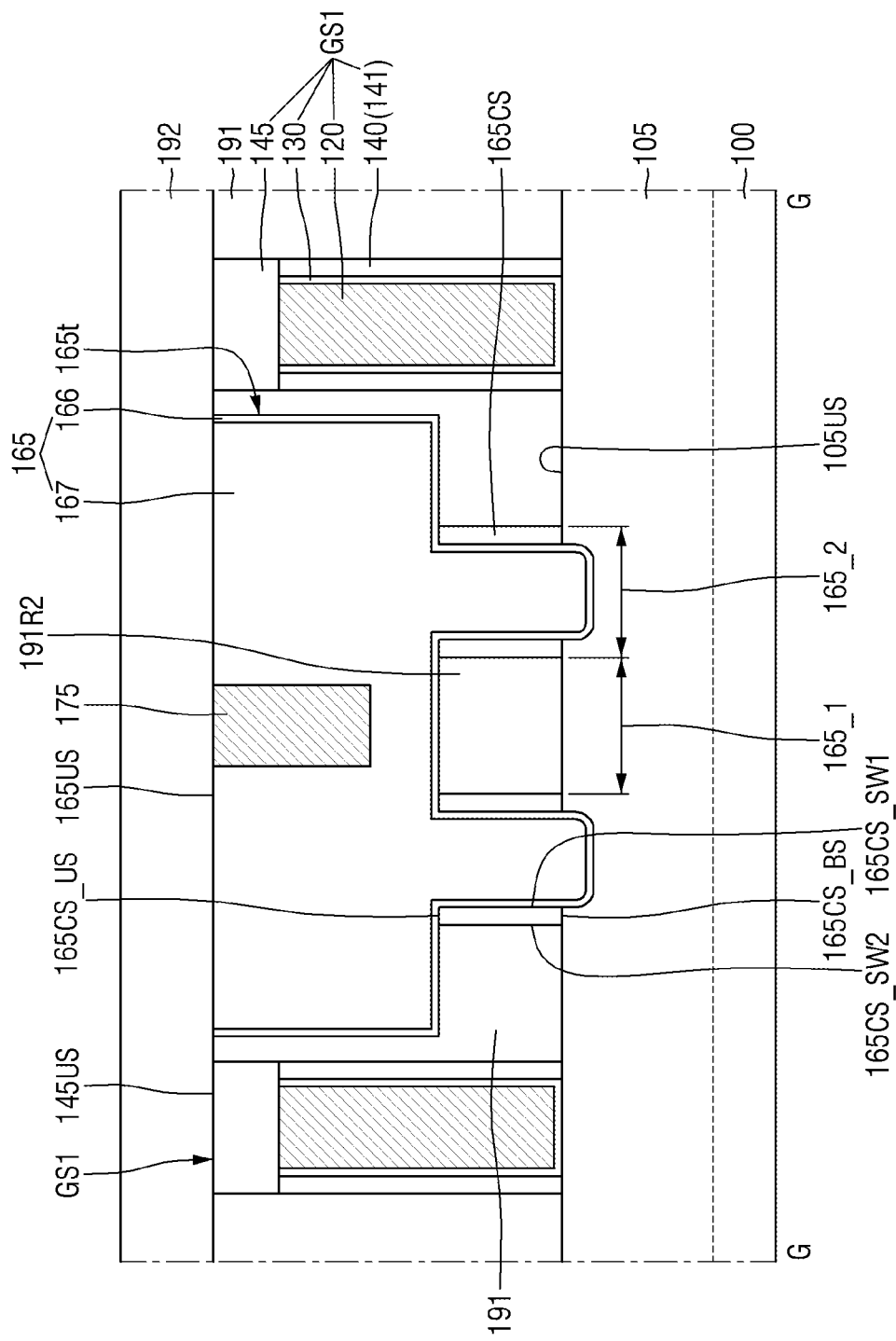
FIGS. 17 and 18 are cross-sectional views of a semiconductor device according to some embodiments of the present disclosure.
Figure 18:
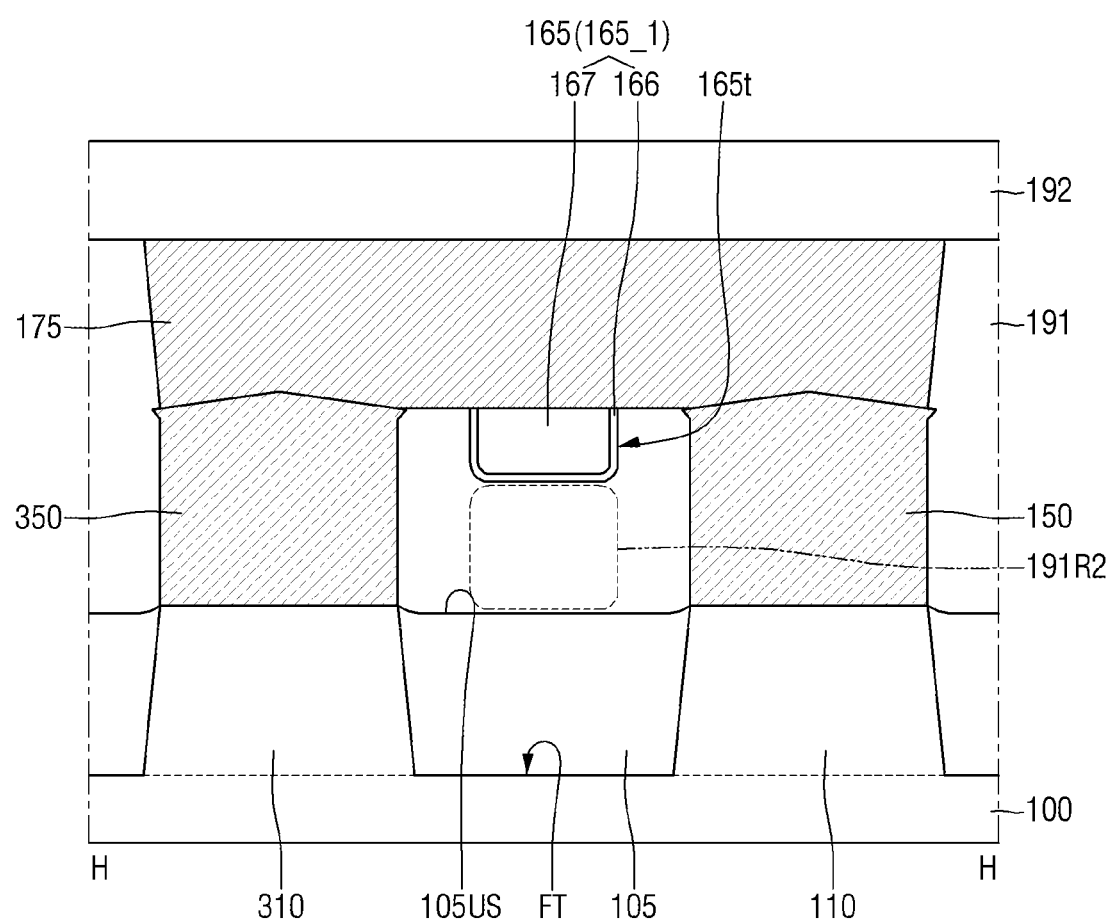

FIGS. 17 and 18 are cross-sectional views of a semiconductor device according to some embodiments of the present disclosure. For convenience, the semiconductor device of FIGS. 17 and 18 will hereinafter be described, focusing mainly on the differences with respect to the semiconductor device of FIGS. 13 through 16. FIGS. 17 and 18 are cross-sectional views along lines G-G and H-H, respectively, of FIG. 13.

Referring to FIGS. 17 and 18, the semiconductor device according to some embodiments of the present disclosure may further include a first connecting source/drain contact 175 on the first and third source/drain patterns 150 and 350. The first connecting source/drain contact 175 may be connected to the first and third source/drain patterns 150 and 350. The top surface of the first connecting source/drain contact 175 may be placed on the same plane as the top surface 165US of the second gate separation structure 165.

Part of the first connecting source/drain contact 175 may be disposed in the second gate separation structure 165. The first connecting source/drain contact 175 may penetrate the second gate separation structure 165 in the second direction D2. The first connecting source/drain contact 175 may include, e.g., at least one of a metal, a metal alloy, a conductive metal nitride, and a 2D material.

Figure 19:
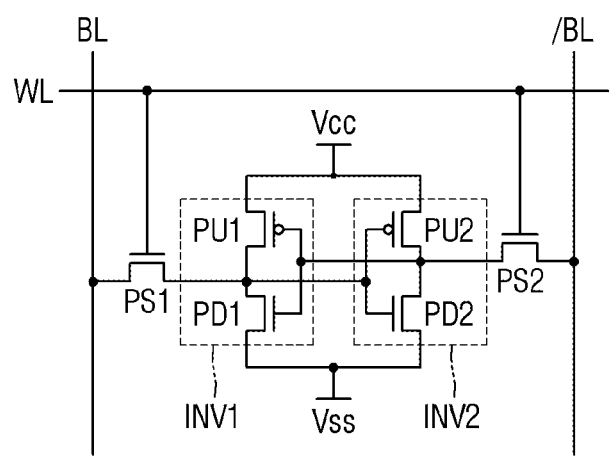
FIG. 19 is a circuit diagram of a semiconductor device according to some embodiments of the present disclosure.

FIG. 19 is a circuit diagram of a semiconductor device according to some embodiments.

Figure 20:
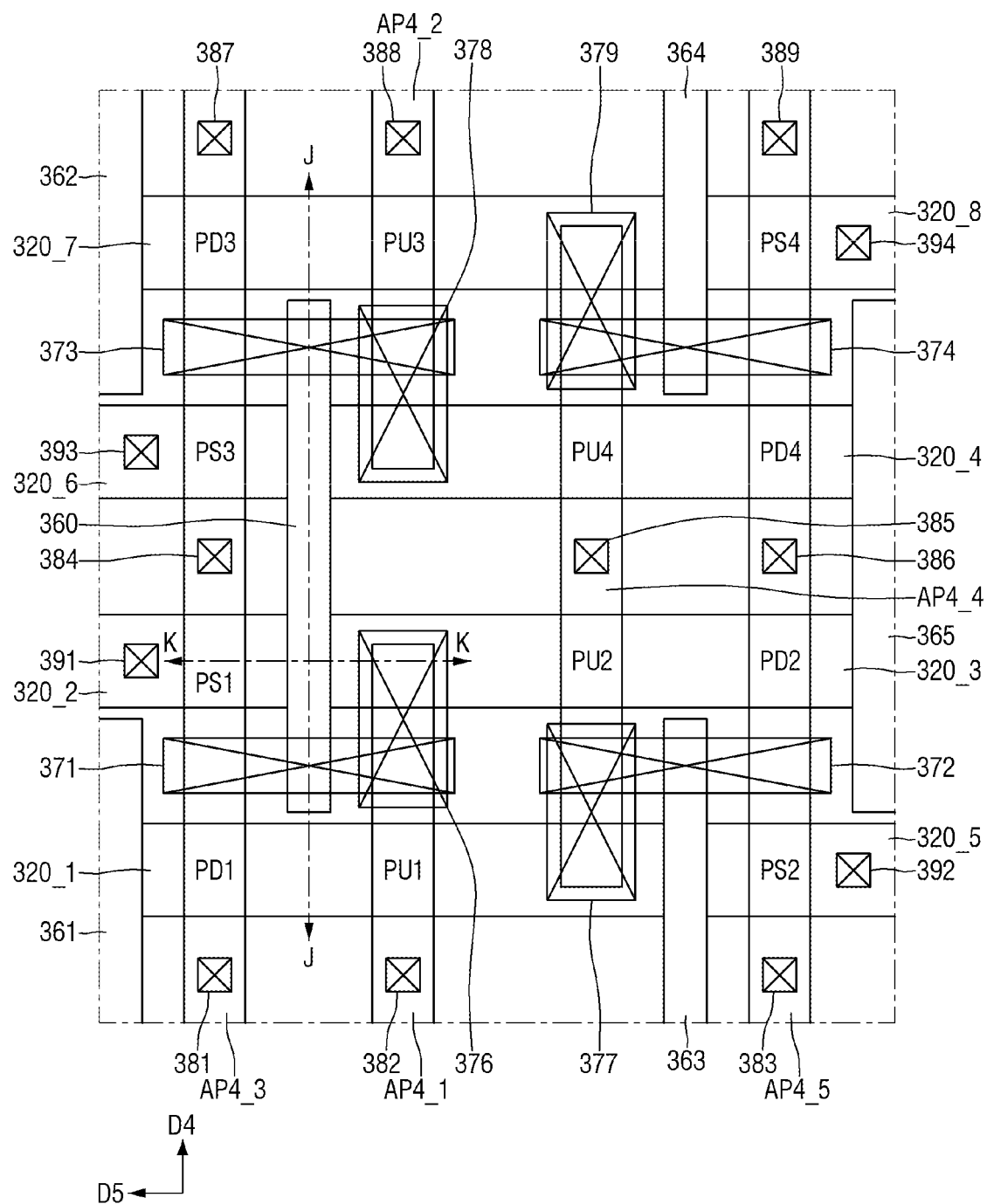
FIG. 20 is an expanded layout view of the semiconductor device of FIG. 19.

FIG. 20 is an expanded layout view of the semiconductor device of FIG. 19. In detail, FIG. 20 is a layout view of a semiconductor device in which two pairs of inverters (INV1 and INV2) are arranged in series. For convenience, wire lines included in a back end-of-line (BEOL) are not illustrated in FIG. 20.

Referring to FIGS. 19 and 20, the semiconductor device according to some embodiments may include a pair of first and second inverters INV1 and INV2, which are connected in parallel between a power supply node Vcc and a ground node Vss, and first and second pass transistors PS1 and PS2, which are connected to the output nodes of the first and second inverters INV1 and INV2, respectively. The first and second pass transistors PS1 and PS2 may be connected to a bitline BL and a complementary bitline/BL, respectively. The gates of the first and second pass transistors PS1 and PS2 may be connected to a wordline WL.

The first inverter INV1 may include a first pull-up transistor PU1 and a first pull-down transistor PD1, which are connected in series between the power supply node Vcc and the ground node Vss, and the second inverter INV2 may include a second pull-up transistor PU2 and a second pull-down transistor PD2, which are connected in series between the power supply node Vcc and the ground node Vss. The first and second pull-up transistors PU1 and PU2 may be P-type transistors, and the first and second pull-down transistors PD1 and PD2 may be N-type transistors.

To form a single latch circuit, the input node of the first inverter INV1 may be connected to the output node of the second inverter INV2, and the input node of the second inverter INV2 may be connected to the output node of the first inverter INV1.

A fourth active pattern may include five sub patterns (AP4_1, AP4_2, AP4_3, AP4_4, and AP4_5), which may be disposed in a static random-access memory (SRAM). Three of the five sub patterns (i.e., first, second, and fourth sub pattern AP4_1, AP4_2, and AP4_4) may be disposed in a PMOS region of the SRAM, while two of the five sub patterns (i.e., the third and fifth sub patterns AP4_3 and AP4_5) may be disposed in an NMOS region of the SRAM.

The sub patterns of the fourth active pattern (AP4_1, AP4_2, AP4_3, AP4_4, and AP4_5) may extend in a fourth direction D4. The first, second, and fourth sub patterns AP4_1, AP4_2, and AP4_4 may be disposed between the third and fifth sub patterns AP4_3 and AP4_5, which are spaced apart from each other in a fifth direction D5. The descriptions of the first, second, and third active patterns AP1, AP2, and AP3 of FIGS. 1 through 7 may be applicable to the five sub patterns of the fourth active patterns (AP4_1, AP4_2, AP4_3, AP4_4, and AP4_5).

The first and second sub patterns AP4_1 and AP4_2 may be arranged along the fourth direction D4. The first and second sub patterns AP4_1 and AP4_2 may be spaced apart from each other in the fourth direction D4. The third sub pattern AP4_3 may be spaced apart from the first and second sub patterns AP4_1 and AP4_2 in the second direction D2. The fourth sub pattern AP4_4 may be spaced apart from the first and second sub patterns AP4_1 and AP4_2 in the fifth direction D5. The fourth sub pattern AP4_4 may overlap with parts of the first and second sub patterns AP4_1 and AP4_2 in the fifth direction D5. The first, second, and fourth sub patterns AP4_1, AP4_2, and AP4_4 may be arranged in a zigzag fashion in the fourth direction D4. The fourth sub pattern AP4_4 may be spaced apart from the fifth sub pattern AP4_5 in the fifth direction D5.

Third gate electrodes (i.e., first through eighth sub gate electrodes 320_1 through 320_8) may extend in the fifth direction D5. The first and fifth sub gate electrodes 320_1 and 320_5 may be arranged along the fifth direction D5. The second and third sub gate electrodes 320_2 and 320_3 may be arranged along the fifth direction D5. The fourth and sixth sub gate electrodes 320_3 and 3206 may be arranged along the fifth direction D5. The seventh and eighth sub gate electrodes 320_7 and 3208 may be arranged along the fifth direction D5.

The first, second, sixth, and seventh sub gate electrodes 320_1, 320_2, 320_6, and 320_7 may intersect the third sub pattern AP4_3. The first sub gate electrode 3201 may intersect the first and fourth sub patterns AP4_1 and AP4_4. The seventh sub gate electrode 320_7 may intersect the second and fourth sub patterns AP4_2 and AP4_4. The third, fourth, fifth, and eighth sub gate electrodes 320_3, 320_4, 320_5, and 320_8 may intersect the fifth sub pattern AP4_5. The third sub gate electrode 320_3 may intersect the first and fourth sub patterns AP4_1 and AP4_4. The fourth sub gate electrode 320_4 may intersect the second and fourth sub patterns AP4_2 and AP4_4. The first and seventh sub gate electrodes 320_1 and 320_7 may intersect a terminal part of the fourth sub pattern AP4_4. The third sub gate electrode 320_3 may intersect a terminal part of the first sub pattern AP4_1. The fourth sub gate electrode 320_4 may intersect a terminal part of the second sub pattern AP4_2.

The first pull-up transistor PU1 may be defined around a region where the first sub gate electrode 320_1 and the first sub pattern AP4_1 intersect each other. The first pull-down transistor PD1 may be defined around a region where the first sub gate electrode 320_1 and the third sub pattern AP4_3 intersect each other. The first pass transistor PS1 may be defined around a region where the second sub gate electrode 320_2 and the third sub pattern AP4_3 intersect each other.

The second, third, and fourth pull-up transistors PU2, PU3, and PU4, the second, third, and fourth pull-down transistors PD2, PD3, and PD4, and the second, third, and fourth pass transistors PS2, PS3, and PS4 may be defined around the regions where the third gate electrodes (i.e., the first through eighth sub gate electrodes 320_1 through 320_8) intersect the fourth active patterns (AP4_1 through AP4_5).

The first and second pull-up transistors PU1 and PU2, the first and second pull-down transistors PD1 and PD2, and the first and second pass transistors PS1 and PS2 may be included in a first SRAM cell. The third and fourth pull-up transistors PU3 and PU4, the third and fourth pull-down transistors PD3 and PD4, and the third and fourth pass transistors PS3 and PS4 may be included in a second SRAM cell. The first and second SRAM cells may be connected to their respective bitlines BL and their respective complementary bitlines/BL.

FIG. 20 illustrates that each pull-down transistor or each pass transistor is defined at a location where one gate electrode intersects one active pattern, but the present disclosure is not limited thereto. Alternatively, each pull-down transistor or each pass transistor may be defined at a location where one gate electrode intersects multiple active patterns.

A plurality of third gate separation structures (360 through 365) separate pairs of adjacent third gate electrodes (i.e., first thorough eighth sub gate electrodes 320_1 through 320_8) in the fifth direction D5. The first sub gate electrode 320_1 may be separated by second and fourth sub gate separation structures 361 and 363. The second and sixth sub gate electrodes 320_2 and 320_6 may be separated by a first sub gate separation structure 360. The third and fourth sub gate electrodes 320_3 and 3204 may be separated by a fourth sub gate separation structure 365. The fifth sub gate electrode 3205 may be separated by a fourth sub gate separation structure 363. The seventh sub gate electrode 320_7 may be separated by a first sub gate separation structures 362 and 364. The eighth sub gate electrode 3208 may be separated by a fifth sub gate separation structure 364.

A plurality of first through fourth bridge contacts 371 through 374 may be contacts that connect the source/drain regions of the pull-up transistors, the pull-down transistors, and the pass transistors of FIG. 19. As the first through fourth bridge contacts 371 through 374 are connected to source/drain regions, the first through fourth bridge contacts 371 through 374 may be bridge source/drain contacts.

The first bridge contact 371 may be connected to the source/drain region of the first pull-up transistor PU1, the source/drain region of the first pull-down transistor PD1, and the source/drain region of the first pass transistor PS1. For example, the first bridge contact 371 may be disposed between the first and second sub gate electrodes 320_1 and 320_2 and between the first and third sub gate electrodes 320_1 and 320_3. The second bridge contact 372 may be connected to the source/drain region of the second pull-up transistor PU2, the source/drain region of the second pull-down transistor PD2, and the source/drain region of the second pass transistor PS2. The third bridge contact 373 may be connected to the source/drain region of the third pull-up transistor PU3, the source/drain region of the third pull-down transistor PD3, and the source/drain region of the third pass transistor PS3. The fourth bridge contact 374 may be connected to the source/drain region of the fourth pull-up transistor PU4, the source/drain region of the fourth pull-down transistor PD4, and the source/drain region of the fourth pass transistor PS4.

A plurality of first through fourth node contacts 376 through 379 may be contacts that connect the gates of the pull-up transistors and the pull-down transistors of FIG. 19 that are connected in series between the power supply node Vcc and the ground node Vss to the first through fourth bridge contacts 371 through 374.

The first node contact 376 may connect the first bridge contact 371 to the third sub gate electrode 320_3. The third sub gate electrode 320_3 may be the gates of the second pull-up and pull-down transistors PU2 and PD2. The second node contact 377 may connect the second bridge contact 372 to the first sub gate electrode 320_1. The first sub gate electrode 320_1 may be the gates of the first pull-up and pull-down transistors PU1 and PD1. The third node contact 378 may connect the third bridge contact 373 to the fourth sub gate electrode 320_4. The fourth sub gate electrode 320_4 may be the gates of the fourth pull-up and pull-down transistors PU4 and PD4. The fourth node contact 379 may connect the fourth bridge contact 374 to the seventh sub gate electrode 320_7. The seventh sub gate electrode 320_7 may be the gates of the third pull-up and pull-down transistors PU3 and PD3.

A plurality of first through ninth SRAM source/drain contacts 381 through 389 may be contacts connected to the power supply node Vcc, the ground node Vss, the bitline BL, and the complementary bitline/BL of FIG. 19.

The second, fifth, and eighth SRAM source/drain contacts 382, 385, and 388 are connected to the power supply node Vcc. The first, sixth, and seventh SRAM source/drain contacts 381, 386, and 387 are connected to the ground node Vss. The third, fourth, and ninth SRAM source/drain contacts 383, 384, and 389 are connected to one of the bitline BL and the complementary bitline/BL.

A plurality of first through fourth SRAM gate contacts 391 through 394 may be connected to the wordline WL of FIG. 19.

A cross-sectional view taken along line J-J of FIG. 20 may correspond to FIG. 15, which is a cross-sectional view taken along line G-G of FIG. 13. A cross-sectional view taken along line K-K of FIG. 20 may correspond to FIG. 16, which is a cross-sectional view taken along line H-H of FIG. 13. The locations and the shape of the first and third bridge contacts 171 and 173 may be apparent from the location and the shape of the first connecting source/drain contact 175 of FIGS. 17 and 18.

Figure 21:
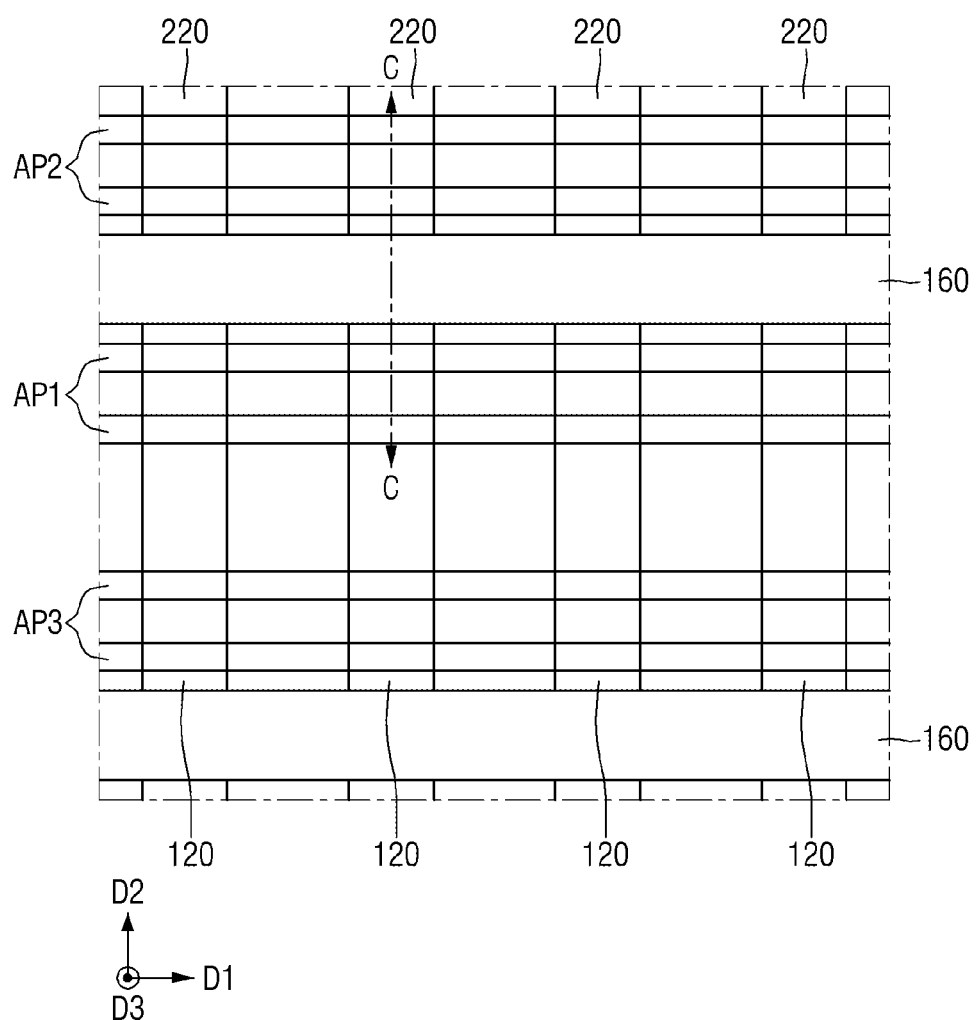
FIGS. 21 through 23 are layout views or cross-sectional views of a semiconductor device according to some embodiments of the present disclosure.
Figure 22:
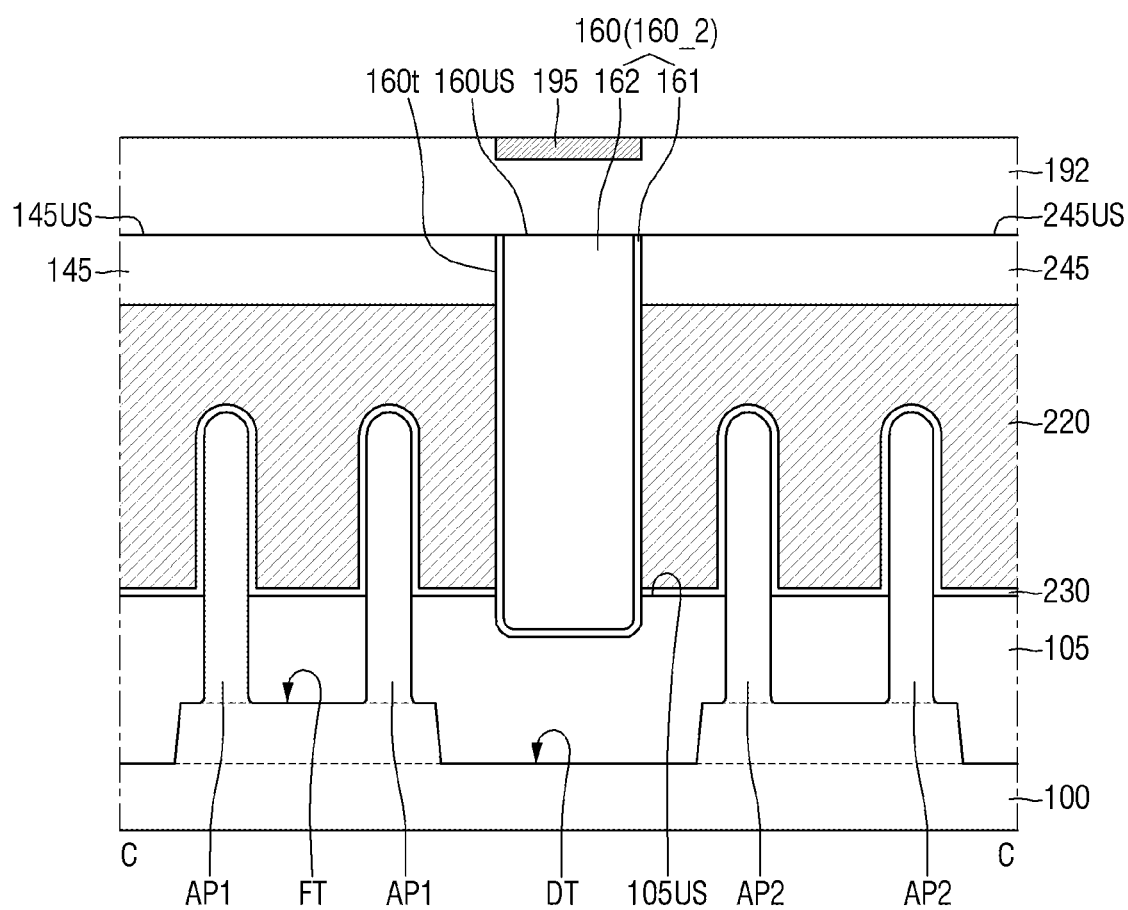
Figure 23:
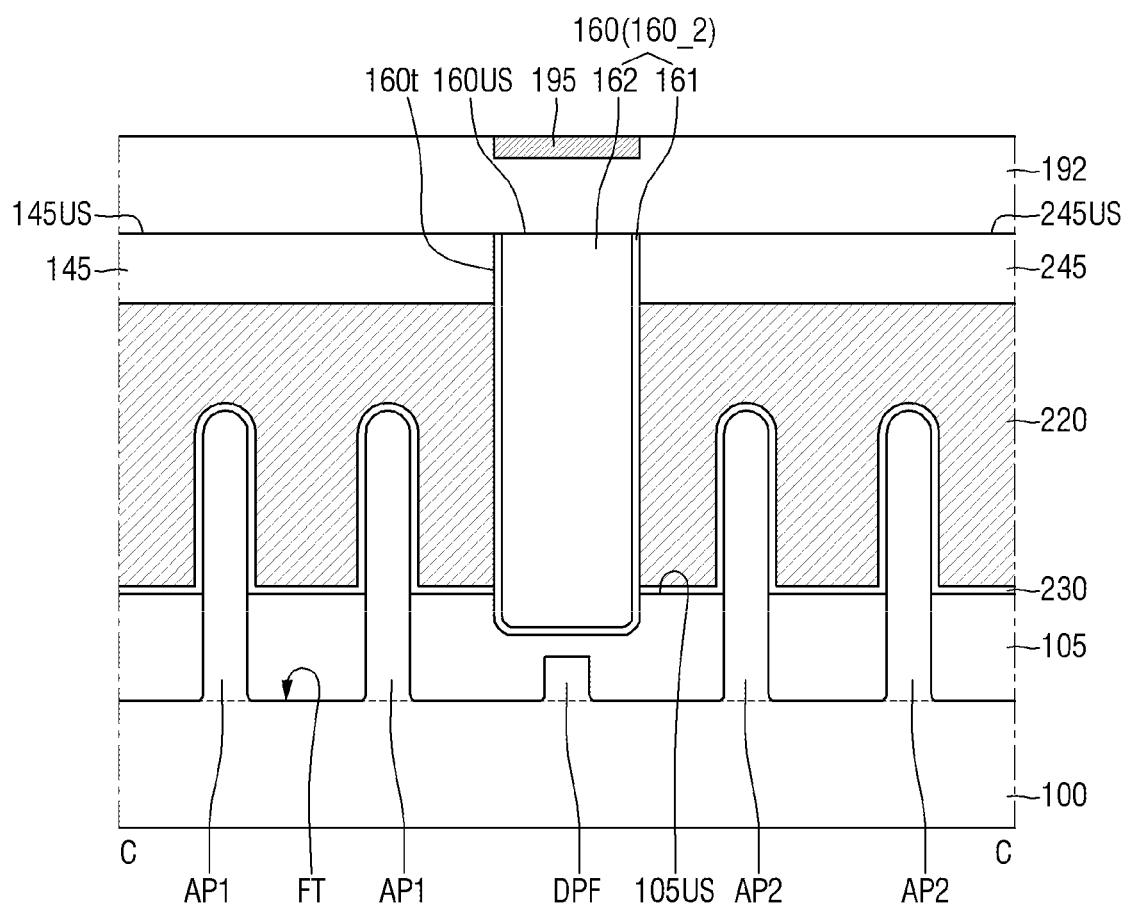

FIGS. 21 through 23 are layout views or cross-sectional views of a semiconductor device according to some embodiments of the present disclosure. For convenience, the semiconductor device of FIGS. 21 through 23 will hereinafter be described, focusing mainly on the differences with respect to the semiconductor device of FIGS. 1 through 7. In detail, FIG. 21 is a layout view of a semiconductor device according to some embodiments of the present disclosure, and FIGS. 22 and 23 are cross-sectional views taken along line C-C of FIG. 21.

Referring to FIGS. 21 through 23, first active patterns AP1, second active patterns AP2, and third active patterns AP3 may be fin-type patterns. The first active patterns AP1, the second active patterns AP2, and the third active patterns AP3 may be defined by fin trenches FT.

The first gate electrodes 120 may cover pairs of sidewalls of parts of the first active patterns AP1 that protrude beyond the top surfaces 105US of the field insulating films 105. The second gate electrodes 220 may cover pairs of sidewalls of parts of the second active patterns AP2 that protrude beyond the top surfaces 105US of the field insulating films 105. The first gate insulating film 130 may be formed along the profiles of the parts of the first active patterns AP1 that protrude beyond the top surfaces 105US of the field insulating films 105. The second gate insulating film 230 may be formed along the profiles of the parts of the second active patterns AP2 that protrude beyond the top surfaces 105US of the field insulating films 105.

Referring to FIG. 22, the first active patterns AP1, the second active patterns AP2, and the third active patterns AP3 may be disposed in active regions defined by deep trenches DT. The first gate separation structures 160 may be disposed on the field insulating films 105 that fill the deep trenches DT.

Referring to FIG. 23, the first active patterns AP1, the second active patterns AP2, and the third active patterns AP3 may be disposed between dummy fin-type patterns DPF, which are adjacent to one another in the second direction D2. The top surfaces of the dummy fin-type patterns DPF may be covered by the field insulating film 105.

FIGS. 21 through 23 illustrate that there are provided two first active patterns AP1, two second active patterns AP2, and two third active patterns AP3, but the present disclosure is not limited thereto. Alternatively, only one first active pattern AP1, only one second active pattern AP2, and only one third active pattern AP3 may be provided, or three or more first active patterns AP1, three or more second active patterns AP2, and three or more third active patterns AP3 may be provided.

FIGS. 24 through 32 are layout views or cross-sectional views illustrating stages in a method of fabricating a semiconductor device according to some embodiments of the present disclosure. The second gate separation structure 165 of FIGS. 13 through 16 can be obtained by using the method of FIGS. 24 through 32.

In detail, FIGS. 25, 27, 29, and 31 are cross-sectional views taken along line L-L of FIG. 24, and FIGS. 26, 28, 30, and 32 are cross-sectional views taken along line M-M of FIG. 24. Descriptions of elements or features that have been described above with reference to FIGS. 1 through 23 will be omitted or simplified.

Figure 25:
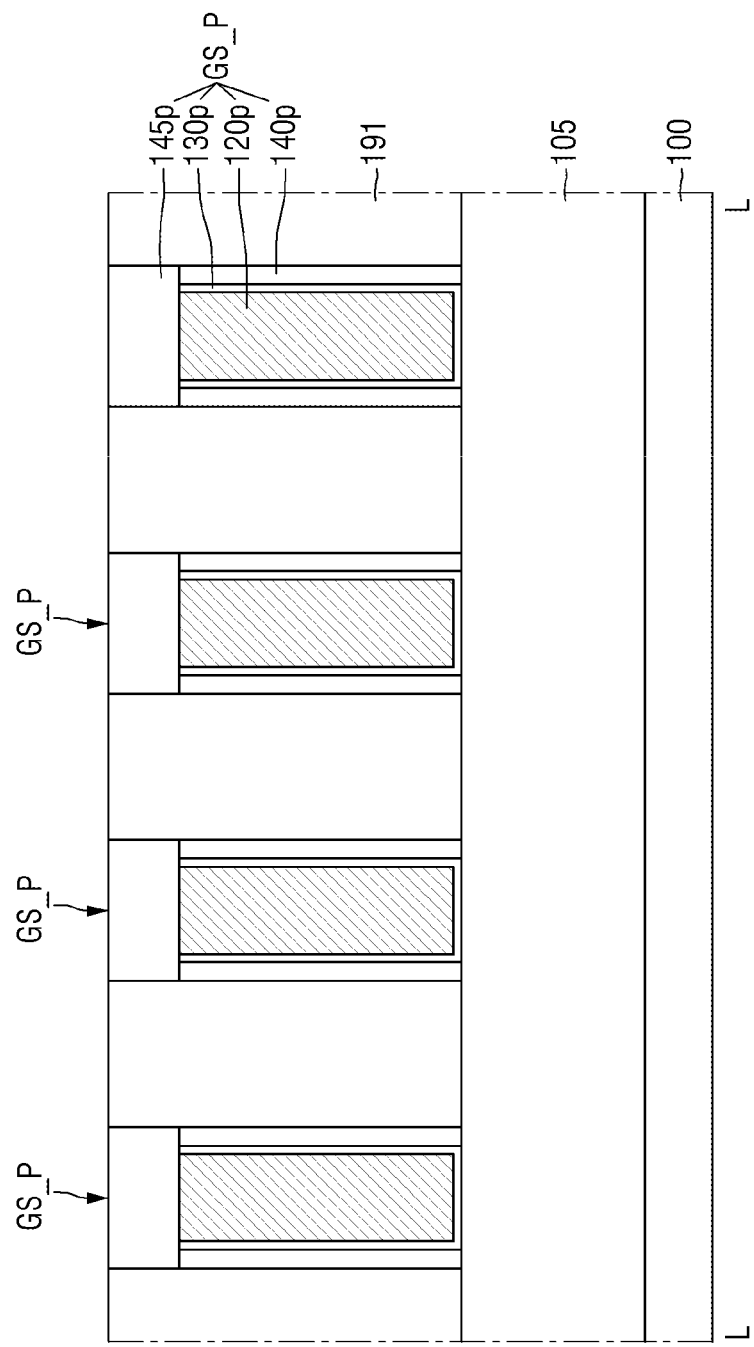
Figure 26:
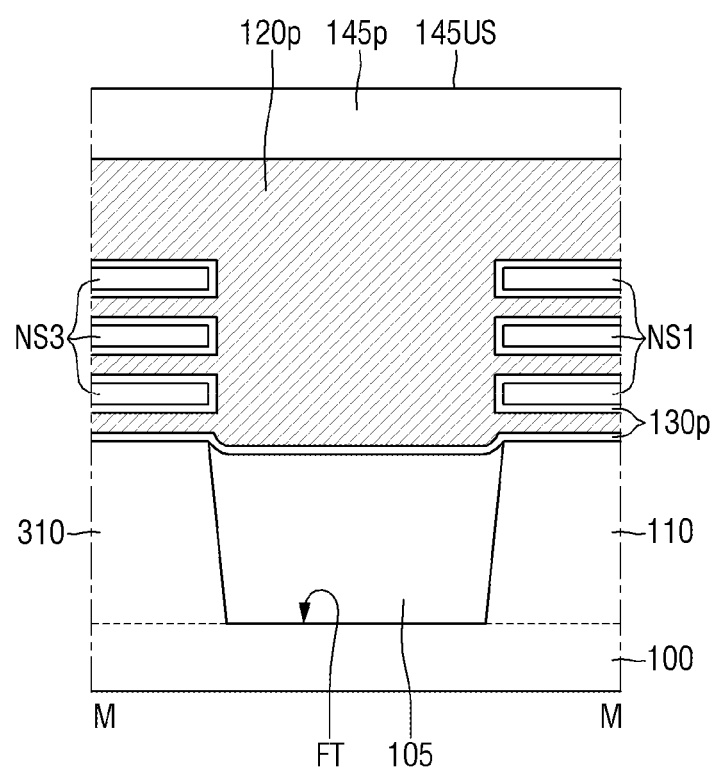

Referring to FIGS. 24 through 26, pre-gate structures GS_P, which extend in the second direction D2, may be formed on first, second, and third active patterns AP1, AP2, and AP3, which extend in the first direction D1. The pre-gate structures GS_P may include pre-gate electrodes 120p, pre-gate insulating films 130p, pre-gate spacers 140p, and pre-gate capping patterns 145p.

The pre-gate insulating films 130p may be formed along the circumferences of the first sheet patterns NS1 and the circumferences of the second sheet patterns NS2. The pre-gate electrodes 120p may surround the first sheet patterns NS1 and the second sheet patterns NS2.

The first interlayer insulating films 191 may be formed on the field insulating film 105. The first interlayer insulating films 191 may cover pairs of sidewalls of the pre-gate electrodes 120p. The top surface of the first interlayer insulating film 191 may be placed on the same plane as top surfaces 145US of the pre-gate capping patterns 145p.

Figure 27:
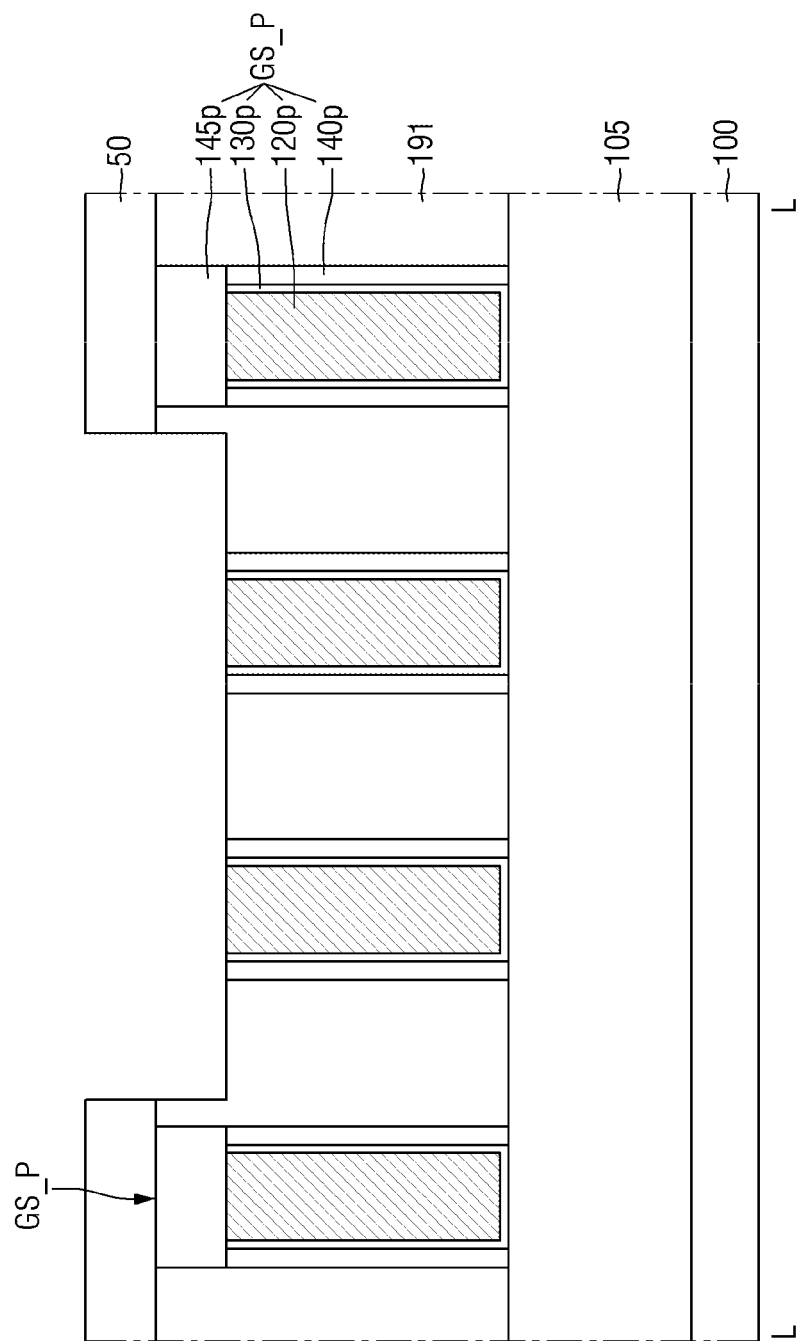
Figure 28:
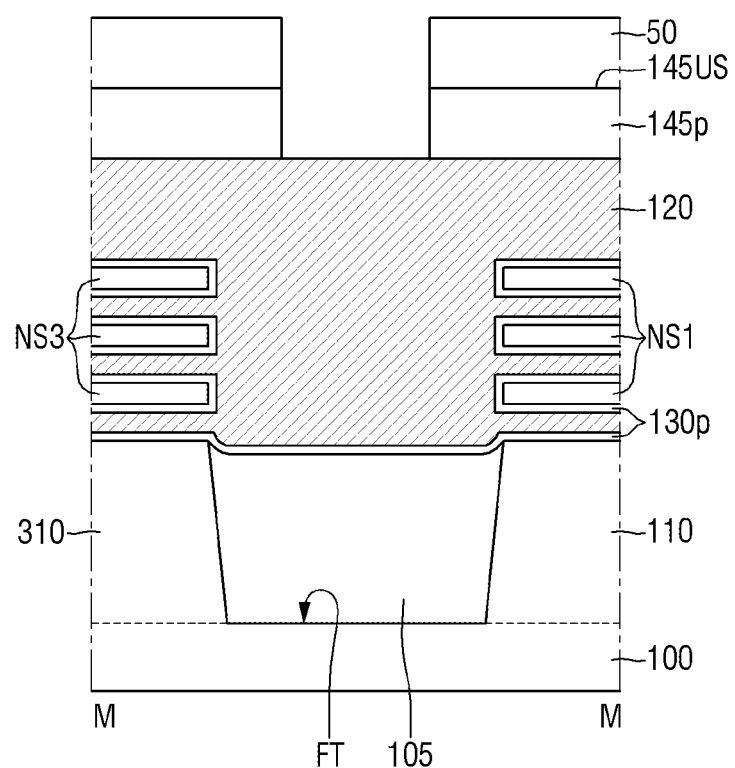

Referring to FIGS. 27 and 28, mask patterns 50 may be formed on the first interlayer insulating films 191 and the pre-gate structures GS_P. Exposed pre-gate capping patterns 145p and exposed parts of the first interlayer insulating films 191 may be removed using the mask patterns 50. As a result, some of the pre-gate electrodes 120p may be exposed.

Alternatively, the first interlayer insulating films 191 may not be removed during the removal of the exposed pre-gate capping patterns 145p.

Figure 29:
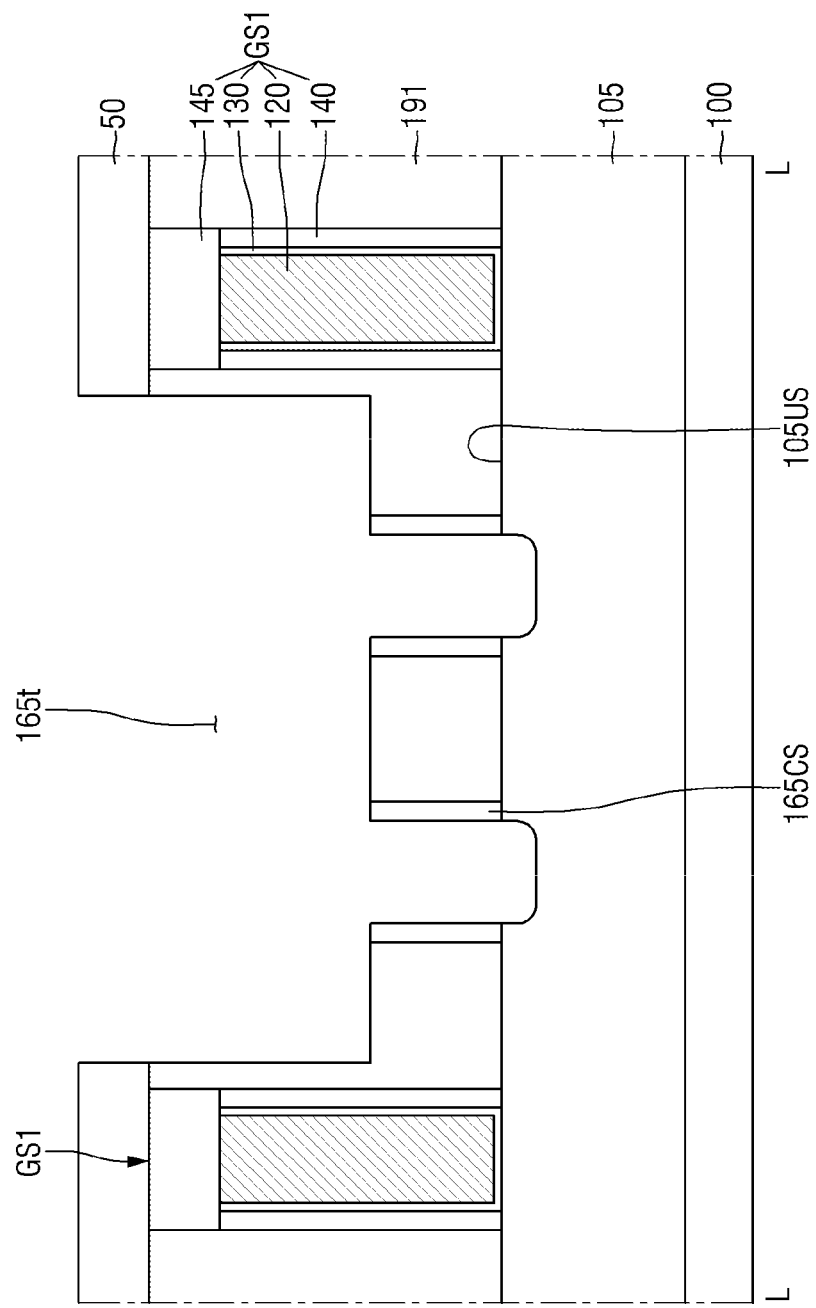
Figure 30:
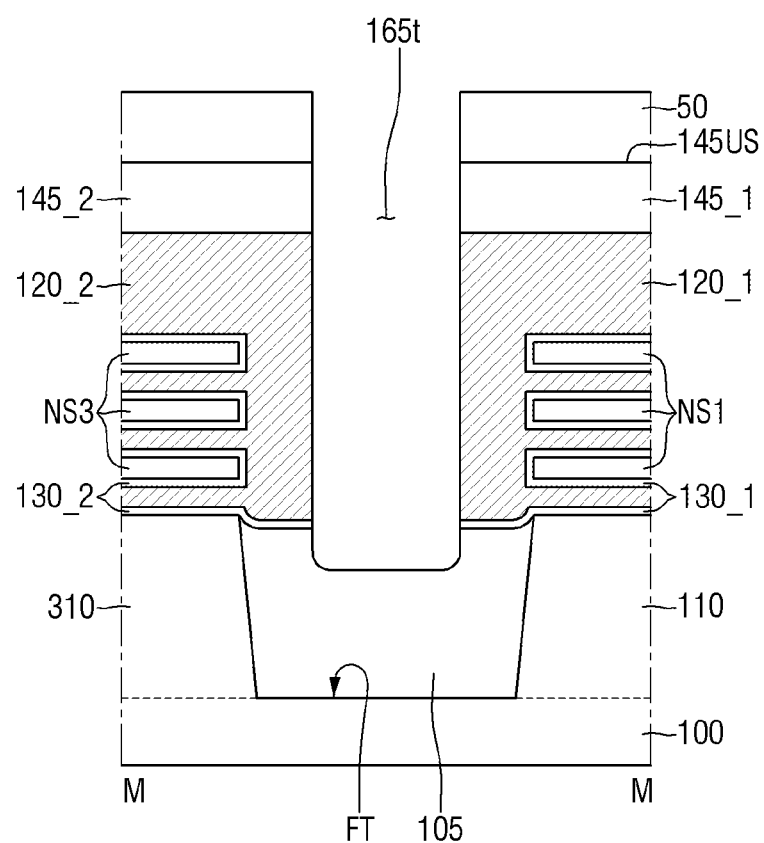

Referring to FIGS. 29 and 30, the exposed pre-gate electrodes 120p and some of the pre-gate insulating films 130p that are exposed by the mask patterns 50 may be removed. As a result, a second gate separation trench 165t may be formed.

During the removal of the exposed pre-gate electrodes 120p, part of the field insulating film 105 may also be removed. During the removal of the exposed pre-gate electrodes 120p, parts of the first interlayer insulating films 191 that are exposed by the mask patterns 50 and parts of the pre-gate spacers 140p that are exposed by the mask patterns 50 may be removed.

Due to the second gate separation trench 165t, the first and second sub gate electrodes 120_1 and 1202 may be formed. Also, the first sub gate insulating films 130_1, the second sub gate insulating films 130_2, the first sub gate capping pattern 145_1, and the second sub gate capping pattern 145_2 may be formed. During the formation of the second gate separation trench 165t, the second connecting spacers 165CS may be formed.

During the formation of the second gate separation trench 165t, the first gate separation trenches 160t of FIG. 7 may be formed between the first and second active patterns AP1 and AP2. As a result, the first gate structures GS1, which are separated by the first gate separation trenches 160t, may be formed. Alternatively, during the formation of the second gate separation trench 165t, the pre-gate spacers 140p may not be removed.

Figure 31:
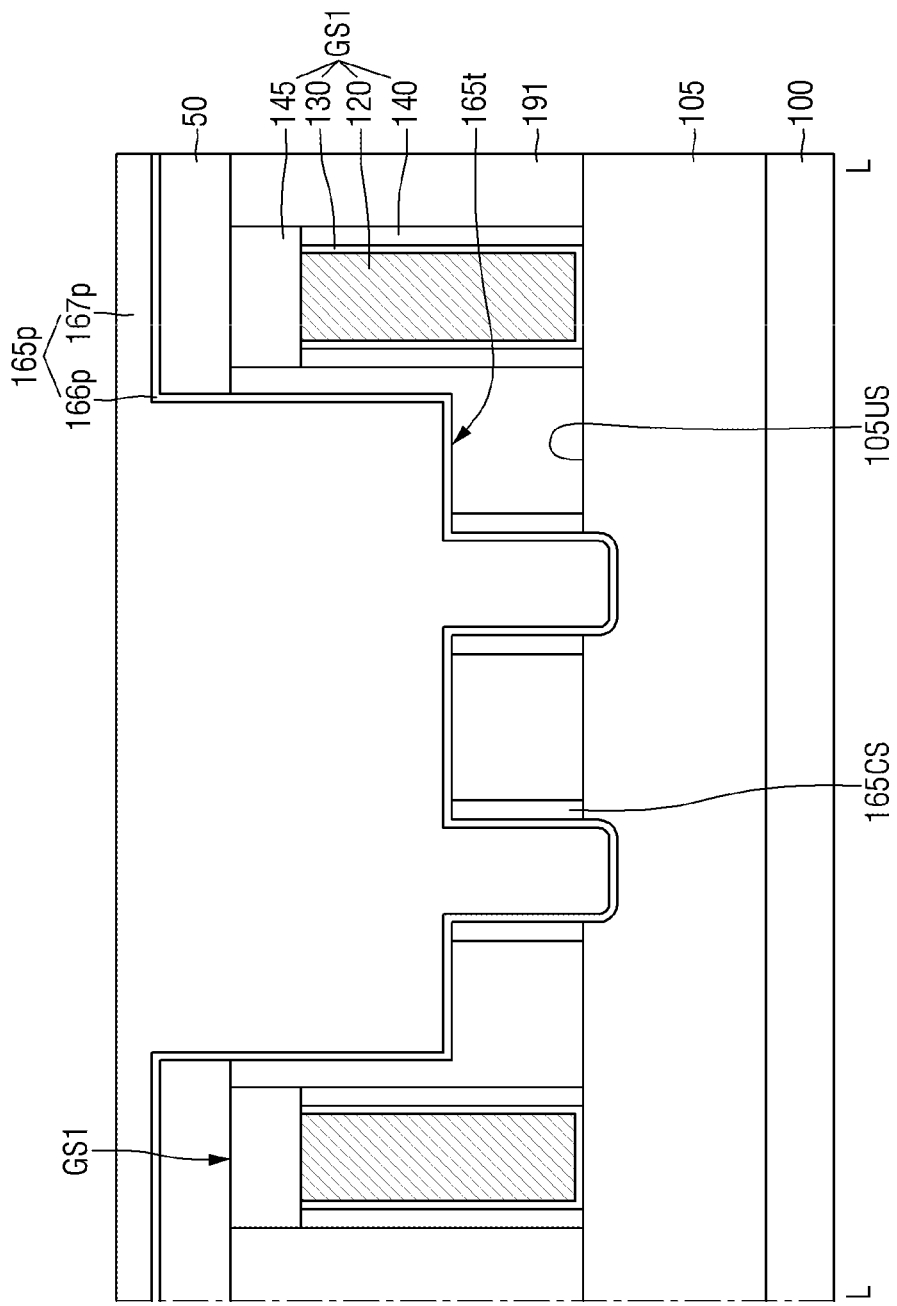
Figure 32:
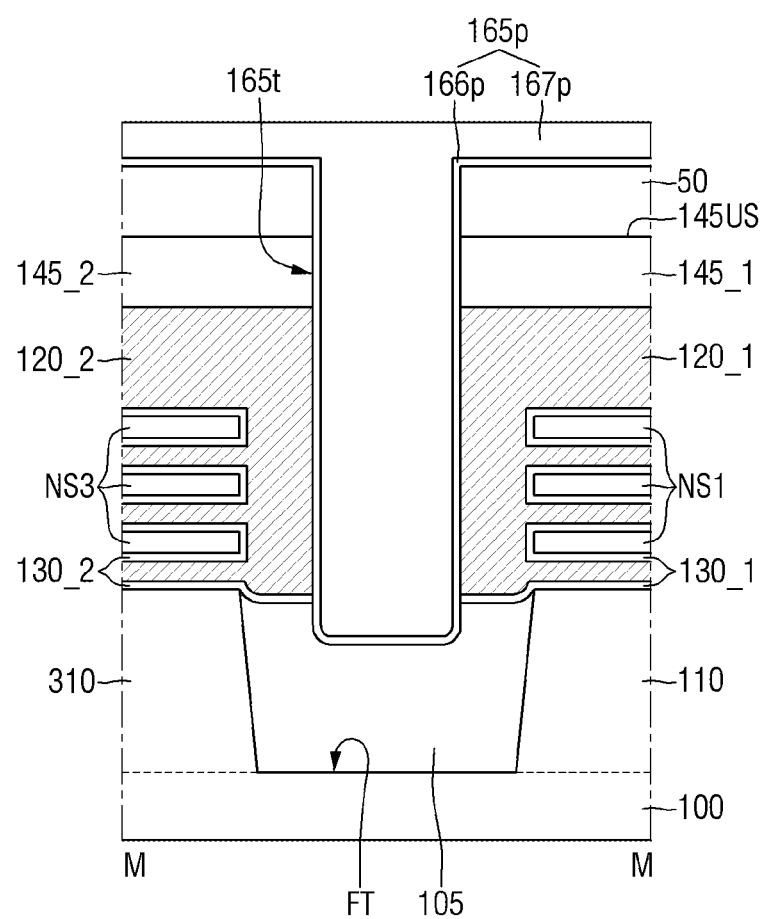

Referring to FIGS. 31 and 32, a pre-gate separation liner 166p may be formed along the profile of the second gate separation trench 165t and the top surfaces of the mask patterns 50. A pre-gate separation filling film 167p may be formed on the pre-gate separation liner 166p to fill the second gate separation trench 165t. Thereafter, the pre-gate separation liner 166p, the pre-gate separation filling film 167p, and the mask patterns 50 may be removed, thereby obtaining the second gate separation structure 165 of FIG. 15.

By way of summation and review, embodiments of the present disclosure provide a semiconductor device capable of improving operation performance and reliability by forming gate insulating supports that separate gate electrodes that are adjacent in a lengthwise direction.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a first fin pattern extending in a first direction;
    second and third fin patterns aligned in the first direction and spaced apart from the first fin pattern in a second direction intersecting the first direction;
    a first gate structure extending in the second direction and intersecting the first fin pattern;
    a second gate structure aligned with the first gate structure in the second direction, and intersecting the second fin pattern;
    a third gate structure spaced apart from the first gate structure in the first direction, and extending in the second direction, and intersecting the first fin pattern;
    a fourth gate structure aligned with the third gate structure in the second direction, and intersecting the third fin pattern; and
    a gate separation structure disposed between the first gate structure and the second gate structure and between the third gate structure and the fourth gate structure, and extending in the first direction, the gate separation structure including a gate separation liner and a gate separation filling film on the gate separation liner.

2. The semiconductor device as claimed in claim 1, wherein:
    the first gate structure includes a gate electrode and a gate insulating film between the gate electrode and the first fin pattern, and
    the gate separation liner is in contact with the gate electrode.

3. The semiconductor device as claimed in claim 2, wherein the gate insulating film does not extending along a sidewall of the gate separation structure.

4. The semiconductor device as claimed in claim 1, further comprising connecting spacer between the first fin pattern and the second fin pattern,
    wherein the gate separation liner contacts the connecting spacer and extends along a top surface and sidewalls of the connecting spacer.

5. The semiconductor device as claimed in claim 4, wherein a portion of the gate separation liner is at a lower level than a bottom surface of the connecting spacer.

6. The semiconductor device as claimed in claim 4, wherein:
    the connecting spacer has first and second sidewall opposed in the second direction, and
    the gate separation liner extends along an entirety of the first sidewall of the connecting spacer and at least a portion of the second sidewall of the connecting spacer.

7. The semiconductor device as claimed in claim 1, further comprising:
    a source/drain pattern on the first fin pattern; and
    a source/drain contact disposed on the source/drain pattern and contacting the gate separation structure.

8. The semiconductor device as claimed in claim 7, wherein the source/drain contact penetrates the gate separation structure in the second direction.

9. The semiconductor device as claimed in claim 1, wherein:
    the first gate structure includes a gate electrode and a gate capping pattern on the gate electrode,
    a top surface of the gate separation structure is on a same plane as a top surface of the gate capping pattern.

10. The semiconductor device as claimed in claim 1, further comprising:
    a fifth gate structure extending in the second direction and intersecting the first fin pattern and the second fin pattern, and
    a sixth gate structure extending in the second direction, and intersecting the first fin pattern and the third fin pattern,
    wherein the gate separation structure is disposed between the fifth gate structure and the sixth gate structure.

11. A semiconductor device, comprising:
a first active pattern including a first lower pattern and first sheet patterns, the first lower pattern extending in a first direction, and the first sheet patterns being spaced apart from the first lower pattern in a second direction;
a second active pattern including a second lower pattern and second sheet patterns, the second lower pattern extending in the first direction and being spaced apart from the first lower pattern in a third direction, the second sheet patterns being spaced apart from the second lower pattern in the second direction;
a third active pattern including a third lower pattern and third sheet patterns, the third lower pattern being aligned with the second lower pattern in the first direction and being spaced apart from the first lower pattern in the third direction, the third sheet patterns being spaced apart from the third lower pattern in the second direction;
a field insulating film between the first and second lower patterns and between the first and third lower patterns;
a gate separation structure disposed on the field insulating film between the first active pattern and the second active pattern and between the first active pattern and the third active pattern, and extending in the first direction, the gate separation structure including a gate separation liner and a gate separation filling film on the gate separation liner,
a first gate structure extending in the third direction, and intersecting the first lower pattern, and including a first gate electrode surrounding the first sheet patterns;
a second gate structure aligned with the first gate structure in the third direction, and intersecting the second lower pattern, and including a second gate electrode surrounding the second sheet patterns;
a third gate structure spaced apart from the first gate structure in the first direction, and extending in the third direction, and intersecting the first lower pattern, and including a third gate electrode surrounding the first sheet patterns; and
a fourth gate structure aligned with the third gate structure in the third direction, and intersecting the third lower pattern, and including a fourth gate electrode surrounding the third sheet patterns.

12. The semiconductor device as claimed in claim 11, wherein the gate separation structure disposed between the first gate structure and the second gate structure and between the third gate structure and the fourth gate structure.

13. The semiconductor device as claimed in claim 12, wherein the gate separation liner is in contact with the first to fourth gate electrodes.

14. The semiconductor device as claimed in claim 12, wherein:
the first gate structure includes a gate insulating film between the first gate electrode and the first sheet patterns, and
the gate insulating film does not extending along a sidewall of the gate separation structure.

15. The semiconductor device as claimed in claim 11, further comprising connecting spacer between the gate separation structure and the field insulating film,
wherein the gate separation liner contacts the connecting spacer and extends along a top surface and sidewalls of the connecting spacer.

16. The semiconductor device as claimed in claim 15, wherein a portion of the gate separation liner is at a lower level than a bottom surface of the connecting spacer.

17. The semiconductor device as claimed in claim 15, wherein:
the connecting spacer has first and second sidewall opposed in the third direction, and
the gate separation liner extends along an entirety of the first sidewall of the connecting spacer and at least a portion of the second sidewall of the connecting spacer.

18. The semiconductor device as claimed in claim 11, further comprising:
a fifth gate structure extending in the third direction and intersecting the first lower pattern and the second lower pattern, and
a sixth gate structure extending in the third direction, and intersecting the first lower pattern and the third lower pattern,
wherein the gate separation structure is disposed between the fifth gate structure and the sixth gate structure.

19. The semiconductor device as claimed in claim 11, further comprising:
a source/drain pattern on the first lower pattern; and
a source/drain contact disposed on the source/drain pattern,
wherein a portion of the source/drain contact overlaps the gate separation structure in the second direction.

20. The semiconductor device as claimed in claim 11, wherein:
the first gate structure includes a gate capping pattern on the first gate electrode,
a top surface of the gate separation structure is on a same plane as a top surface of the gate capping pattern.

* * * * *